(12) United States Patent
Bhattacharyya

(10) Patent No.: US 8,462,557 B2
(45) Date of Patent: Jun. 11, 2013

(54) METHODS OF OPERATING MEMORY CELL HAVING ASYMMETRIC BAND-GAP TUNNEL INSULATOR USING DIRECT TUNNELING

(75) Inventor: Arup Bhattacharyya, Essex Junction, VT (US)

(73) Assignee: Micron Technology, Inc., Boise, ID (US)

(*) Notice: Subject to any disclaimer, the term of this patent is extended or adjusted under 35 U.S.C. 154(b) by 404 days.

(21) Appl. No.: 12/941,458

(22) Filed: Nov. 8, 2010

(65) Prior Publication Data
US 2011/0273931 A1    Nov. 10, 2011

Related U.S. Application Data

(62) Division of application No. 11/181,345, filed on Jul. 14, 2005, now Pat. No. 7,829,938.

(51) Int. Cl.
*G11C 11/34*    (2006.01)

(52) U.S. Cl.
USPC ............................................ 365/185.28

(58) Field of Classification Search
USPC ........... 365/185.01, 185.28, 185.26; 257/239, 257/261, 324, 314, 317
See application file for complete search history.

(56) References Cited

U.S. PATENT DOCUMENTS

| | | |
|---|---|---|
| 4,776,922 A | 10/1988 | Bhattacharyya et al. |
| 5,751,037 A | 5/1998 | Aozasa et al. |
| 5,886,368 A | 3/1999 | Forbes et al. |
| 6,054,734 A | 4/2000 | Aozasa et al. |
| 6,514,828 B2 | 2/2003 | Ahn et al. |
| 6,534,816 B1 | 3/2003 | Caywood |
| 6,586,797 B2 | 7/2003 | Forbes et al. |
| 6,664,589 B2 | 12/2003 | Forbes et al. |
| 6,713,810 B1 | 3/2004 | Bhattacharyya |
| 6,743,681 B2 | 6/2004 | Bhattacharyya |
| 6,754,108 B2 | 6/2004 | Forbes |
| 6,759,712 B2 | 7/2004 | Bhattacharyya |
| 6,768,156 B1 | 7/2004 | Bhattacharyya |
| 6,778,441 B2 | 8/2004 | Forbes et al. |
| 6,784,480 B2 | 8/2004 | Bhattacharyya |
| 6,849,464 B2 | 2/2005 | Drewes |
| 6,864,139 B2 | 3/2005 | Forbes |
| 6,900,455 B2 | 5/2005 | Drewes |
| 6,903,969 B2 | 6/2005 | Bhattacharyya |

(Continued)

FOREIGN PATENT DOCUMENTS

DE    2152225    5/1972

OTHER PUBLICATIONS

R. Ranica et al.; *A new 40nm SONos structure based on backside trapping for nanoscale memories*; 2004; IEEE 2004 Silicon Nanoelectronics Workshop; pp. 99-100.

(Continued)

*Primary Examiner* — Richard Elms
*Assistant Examiner* — Khamdan Alrobaie
(74) *Attorney, Agent, or Firm* — Leffert Jay & Polglaze, P.A.

(57) ABSTRACT

Methods of operating dual-gate memory cells having asymmetric band-gap tunnel insulators using direct tunneling. The asymmetric band-gap tunnel insulators allow for low voltage direct tunneling programming and efficient erase with holes and/or electrons, while maintaining high charge blocking barriers and deep carrier trapping sites for good charge retention.

21 Claims, 11 Drawing Sheets

U.S. PATENT DOCUMENTS

| | | |
|---|---|---|
| 6,917,078 B2 | 7/2005 | Bhattacharyya |
| 6,933,572 B2 | 8/2005 | Bhattacharyya |
| 7,157,769 B2* | 1/2007 | Forbes .......................... 257/321 |
| 2002/0076850 A1 | 6/2002 | Sadd et al. |
| 2002/0140023 A1 | 10/2002 | Ohba et al. |
| 2002/0190311 A1 | 12/2002 | Blomme et al. |
| 2003/0001232 A1 | 1/2003 | Koinuma et al. |
| 2003/0042527 A1 | 3/2003 | Forbes et al. |
| 2003/0042532 A1 | 3/2003 | Forbes |
| 2003/0042534 A1 | 3/2003 | Bhattacharyya |
| 2003/0043632 A1 | 3/2003 | Forbes |
| 2003/0043633 A1 | 3/2003 | Forbes et al. |
| 2003/0045082 A1 | 3/2003 | Eldridge et al. |
| 2003/0048666 A1 | 3/2003 | Eldridge et al. |
| 2003/0049900 A1 | 3/2003 | Forbes et al. |
| 2003/0089942 A1 | 5/2003 | Bhattacharyya |
| 2003/0151948 A1 | 8/2003 | Bhattacharyya |
| 2004/0123085 A1 | 6/2004 | Oikawa et al. |
| 2004/0183122 A1 | 9/2004 | Mine et al. |
| 2005/0201150 A1 | 9/2005 | Wang |
| 2006/0001053 A1 | 1/2006 | Wang |
| 2006/0006454 A1 | 1/2006 | Wang |
| 2006/0017091 A1 | 1/2006 | Wang |
| 2006/0202261 A1* | 9/2006 | Lue et al. ...................... 257/324 |

OTHER PUBLICATIONS

Cheng-Yuan Hsu et al.; *Split-Gate NAND Flash Memory at 120nm Technology Node Featuring Fast Programming and Erase*; 2004; 2004 Symposium on VLSI Technology Digest of Technical Papers; pp. 78-79.

D. Lee et al.; *Vertical floating-gate $4.5F^2$ Split-gate NOR Flash Memory at 110nm Node*; 2004; 2004 Symposium on VLSI Technology Digest of Technical Papers; pp. 72-73.

Robertson; *Band offsets of wide-band-gap oxides and implications for future electronic devices*; May 2000, J. Vac. Sci. Technol. B 18(3), pp. 1785-1791.

* cited by examiner

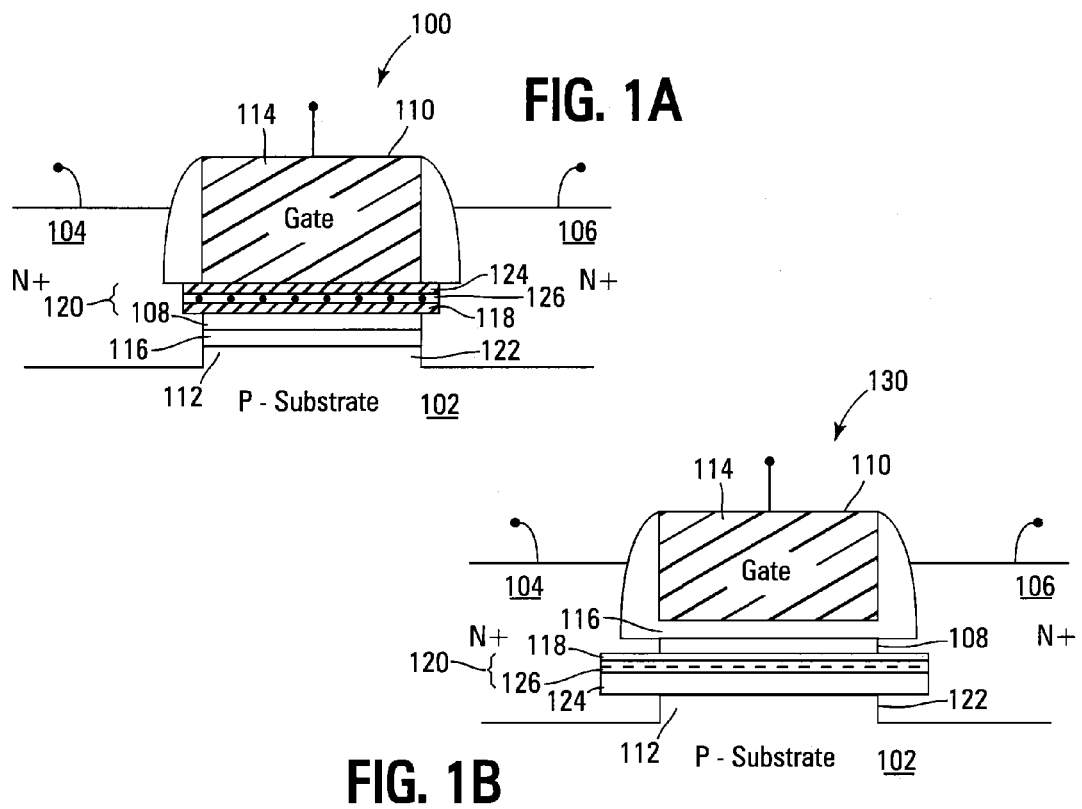
FIG. 1A
FIG. 1B
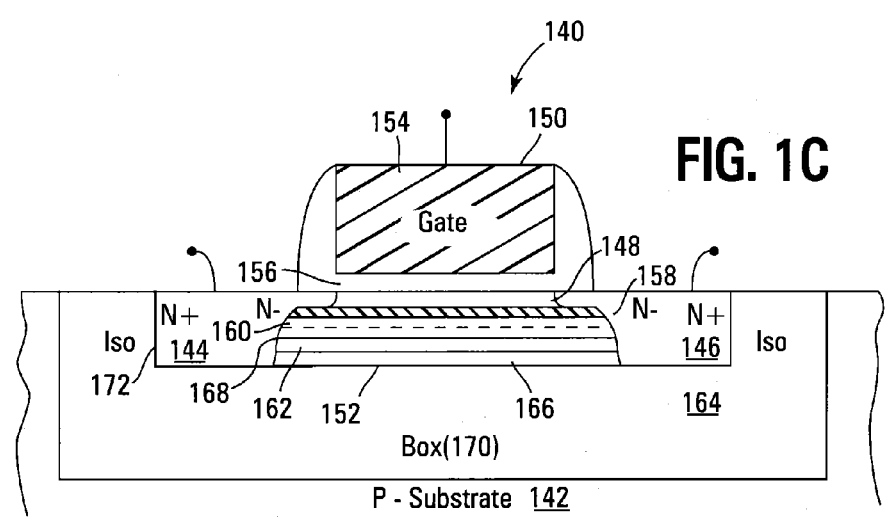
FIG. 1C

METHODS OF OPERATING MEMORY CELL HAVING ASYMMETRIC BAND-GAP TUNNEL INSULATOR USING DIRECT TUNNELING

RELATED APPLICATION

This is a divisional application of U.S. patent application Ser. No. 11/181,345, titled "HIGH DENSITY NAND NON-VOLATILE MEMORY DEVICE," and filed Jul. 14, 2005 (allowed), now U.S. Pat. No. 7,829,938 which is commonly assigned and incorporated by reference in its entirety herein

TECHNICAL FIELD

The present invention relates generally to integrated circuits and in particular the present invention relates to non-volatile memory cells and their operation.

BACKGROUND

Memory devices are typically provided as internal storage areas in the computer. The term memory identifies data storage that comes in the form of integrated circuit chips. There are several different types of memory used in modern electronics, one common type is RAM (random-access memory). RAM is characteristically found in use as main memory in a computer environment. RAM functions as a read and write memory; that is, you can both write data into RAM and read data from RAM. This is in contrast to read-only memory (ROM), which permits you only to read data. Most RAM is volatile, which means that it requires a steady flow of electricity to maintain its contents. As soon as the power is turned off, whatever data was in RAM is lost.

Computers almost always contain a small amount of ROM that holds instructions for starting up the computer. Unlike RAM, ROM cannot be written to. An EEPROM (electrically erasable programmable read-only memory) is a special type non-volatile ROM that can be erased by exposing it to an electrical charge. EEPROM comprise a memory array which includes a large number of memory cells having electrically isolated gates. Data is stored in the memory cells in the form of charge on the floating gates or floating nodes associated with the gates. Each of the cells within an EEPROM memory array can be electrically programmed in a random basis by charging the floating node. The charge can also be randomly removed from the floating node by an erase operation. Charge is transported to or removed from the individual floating nodes by specialized programming and erase operations, respectively.

Yet another type of non-volatile memory is a Flash memory. A Flash memory is a type of EEPROM that is typically erased and reprogrammed in blocks instead of a single bit or one byte (8 or 9 bits) at a time. A typical Flash memory comprises a memory array, which includes a large number of memory cells. Each of the memory cells includes a floating gate field-effect transistor (FET) capable of holding a charge. The data in a cell is determined by the presence or absence of the charge in the floating gate/charge trapping layer. The cells are usually grouped into sections called "erase blocks." Each of the cells within an erase block can be electrically programmed in a random basis by charging the floating gate. The charge can be removed from the floating gate by a block erase operation, wherein all floating gate memory cells in the erase block are erased in a single operation.

The memory cells of both an EEPROM memory array and a Flash memory array are typically arranged into either a "NOR" architecture (each cell directly coupled to a bit line) or a "NAND" architecture (cells coupled into "strings" of cells, such that each cell is coupled indirectly to a bit line and requires activating the other cells of the string for access). To prevent floating gate transistors of a NAND string from being affected by read and write operations on other nearby memory strings or current flow on shared bit lines and thus potentially corrupt data held on the memory string, each memory string is typically isolated from its bit line and/or source line by select gate transistors (also known as pass transistors or isolation transistors) that must be turned on to access the NAND memory string and pass voltage and current signals to and from it. These select transistors also isolate un-accessed NAND memory strings from the shared bit lines and/or source lines so that they do not potentially corrupt data read from memory cells of the accessed memory string, in particular through current leakage from floating gate memory cells that have had too much charge removed from their floating node or gate and therefore are in an overerased state and have a low threshold voltage.

Floating gate memory cells are typically programmed by injecting electrons to the floating gate by channel hot carrier injection (CHE), typically placing the cell in a high threshold voltage state. Floating gate memory cells can also be erased by hot hole injection from the substrate. Alternatively, floating gate memory cells can be programmed and erased by electron tunneling to and from the substrate by Fowler-Nordheim tunneling to put the cell in a programmed or erased threshold state. Both mechanisms require the generation of high positive and negative voltages in the memory device and can place high fields across the gate insulation layers with resulting adverse effects in device characteristics and reliability.

A problem with CHE, hot hole injection and Fowler-Nordheim tunneling is that the high energy required for their operation damages the oxide interfacing silicon substrate, reducing memory cell retention, endurance and degrading transconductance of the FET. In particular, the tunnel insulation layer, which is placed between the channel and the floating node/charge trapping layer is typically damaged by the programming process by having hot carriers injected or tunneled through it. As high control fields are also typically asserted on the channel during writing and erasing through the tunnel insulation layer by the application of voltage to the control gate of the memory cell, damage to the tunnel insulator by the hot carrier injection or high fluence tunneling process can significantly affect device characteristics. Hot carrier injection can generate interface states, degrade device transconductance, and enhance device leakage via enhanced short channel effect, besides affecting charge retention and read-disturb. Hot hole injection can generate fixed charge trapping centers in the tunneling insulators and associated defects in the trapping layer, thus breaking stable bonds and eventually degrading the insulator/dielectric properties of the device. For a conventional Flash or SONOS non-volatile memory device, the same control gate is also used during a read operation as a FET to read the state of the memory cell. When the tunnel insulator (also known as the tunnel oxide) is degraded, the read characteristics of the memory cell are also degraded due to the transconductance degradation and enhanced leakage. This affects the read speed of the memory cell.

A problem in Flash and SONOS memory cell arrays is that voltage scalability affects the minimum cell size, and consequently the overall memory density of any resulting array. Due to the high programming voltage requirement, neighboring cells must be separated sufficiently apart (significantly greater than the minimum feature size) so as not to be disturbed by the capacitive coupling effect during programming of the active cell. This problem is more severe with scaling of the feature size capability affecting cell density. As integrated circuit processing techniques improve, manufacturers try to reduce the feature sizes of the devices produced and thus increase the density of the IC circuits and memory arrays. Additionally, in floating gate memory arrays in particular, the minimum geometry of the floating gate memory cells that make up the memory array and spacing between memory cells in the strings have a large effect on the number of memory cells that can be placed in a given area and thus a direct impact on the density of the array and size of the resulting memory device.

For the reasons stated above, and for other reasons stated below which will become apparent to those skilled in the art upon reading and understanding the present specification, there is a need in the art for a device, method and architecture for producing a more closely spaced and, thus, higher density NAND floating node memory cell string and array that allows for feature and voltage scaling, prevents read degradation while providing enhanced retention, speed, endurance, and exhibits increased device integrity.

BRIEF DESCRIPTION OF THE DRAWINGS

FIGS. 1A-1G detail memory cell and band diagram in accordance with embodiments of the present invention.

DETAILED DESCRIPTION

Figure 1D:
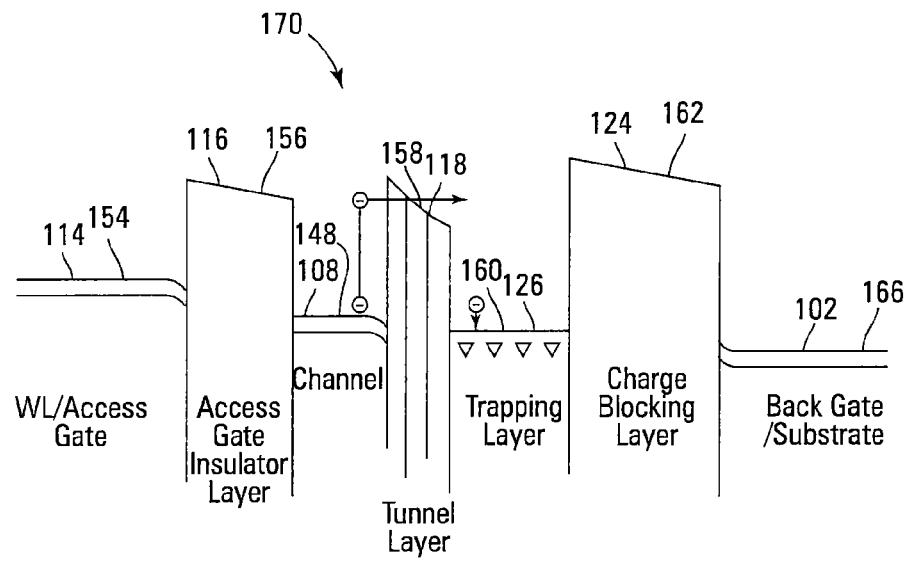

In the following detailed description of the preferred embodiments, reference is made to the accompanying drawings that form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The terms wafer and substrate used previously and in the following description include any base semiconductor structure. Both are to be understood as including bulk silicon, silicon-on-sapphire (SOS) technology, silicon-on-insulator (SOI) technology, silicon-on-nothing, thin film transistor (TFT) technology, doped and undoped semiconductors, epitaxial layers of silicon supported by a base semiconductor, as well as other semiconductor structures well known to one skilled in the art. Furthermore, when reference is made to a wafer or substrate in the following description, previous process steps may have been utilized to form regions/junctions in the base semiconductor structure. The following detailed description is, therefore, not to be taken in a limiting sense, and the scope of the present invention is defined only by the claims and equivalents thereof.

Non-volatile memory devices and arrays, in accordance with embodiments of the present invention, facilitate the utilization of dual gate (or back-side gate) memory cells that have band engineered gate-stacks that are placed above or below a thin body channel region in front-side or back-side charge trapping gate-stack configurations in NAND memory array architectures in EEPROM and block erasable memory devices, such as Flash memory devices. Embodiments of the present invention allow a separate read/access control gate-insulator stack (utilizing either the front or back-side gate) for reading and a separate gate-insulator stack (utilizing the front or back-side gate that is the non-access control gate) for programming (write and erase) and charge storage. Additionally, the embodiments of the present invention allow implementation of the non-volatile memory device on bulk silicon and SOI or SON substrates with thick and thin channel regions/floating bodies formed between the front and back-side gate-insulator stacks (also known as the top or bottom gate-insulator stacks). The band-gap engineered gate-stacks with asymmetric or direct tunnel barriers of the floating node memory cells of embodiments of the present invention allow for low voltage tunneling programming and efficient erase with electrons and holes, while maintaining high charge blocking barriers and deep carrier trapping sites for good charge retention. The direct tunneling program and efficient erase capability reduces damage to the gate-stack and the crystal lattice from high energy carriers, reducing write fatigue and leakage issues and enhancing device lifespan, while allowing for memory cells that can take advantage of progressive lithographic and feature size scaling. In one embodiment, the memory cell architecture allows for improved high density memory devices or arrays with the utilization of reduced feature word lines and vertical select gates that can take advantage of the feature sizes semiconductor fabrication processes are generally capable of and allow for appropriate device sizing for operational considerations. Memory cell embodiments of the present invention also allow multiple levels of bit storage in a single memory cell, and erase with hole injection from the front or back-side control gate.

In dual gate or back-side gate non-volatile memory cell FETs, source and drain regions are formed and are separated by a thin or thick body channel region with a first gate stack (also known as the front gate stack, front-side gate stack, or top gate stack) formed over the channel region and/or portions of the source and drain regions and a second gate-insulator stack (known as the back-side gate stack or bottom gate stack) formed beneath the channel region. In a front-side trap dual-gate or back-side gate non-volatile memory cell, the front-side gate stack acts as the charge trapping gate stack and contains a trapping layer for the storage of charge, with the back-side gate acts as an access gate. In a back-side trap dual-gate or back-side gate non-volatile memory cell (also known as a back-side trap non-volatile memory cell) the back-side gate stack acts as the charge trapping gate stack and contains a trapping layer for the storage of charge, with the front-side gate acts as an access gate.

In embodiments of the present invention, the access gate stack (the non-charge trapping gate stack of the dual-gate non-volatile memory cell) comprises a layer of trap-free insulation and a control gate (the access gate), forming a FET device which allows for the formation of minority carriers in the channel and control of the carrier flow from the source to the drain through the channel via the voltage applied to the access gate. This access gate FET is typically used exclusively for sensing (reading) the state of the memory cell. The charge storing trapping layer gate stack is employed for charge storage and programming (writing and erasing). This device element typically comprises successive layers of tunnel insulation, a floating node trapping layer (or, alternatively, a conductive floating gate), a charge blocking insulation layer and a control gate. This charge trapping gate stack, with its electrically isolated trapping layer, allows charge to be trapped near the channel region and affect the threshold voltage level of the non-volatile memory cell.

The front-side control gate can be formed of aluminum, tungsten, polysilicon or other conductor material and is typically coupled to a word line or control line. The back-side control gate can be formed of aluminum, tungsten, polysilicon or other conductor material and be independently coupled to a control line or, as is in the case of an SOI or bulk implementation, be formed from the substrate. Such dual-gate or back-side gate non-volatile memory cell FETs are also referred to as a vertically integrated "dual gate transistor non-volatile memory devices."

Conventional SONOS memory cell devices typically employ successive layers of oxide/nitride/oxide (ONO) as the insulator stack between the silicon substrate and the heavily doped polysilicon control gate (or metal gate). The oxide adjacent to the silicon substrate is usually thinner and acts as a tunnel insulation layer (also known as a tunnel oxide) while the thicker oxide adjacent to the control gate acts as the charge blocking oxide. Trapped charges stored in the device are typically held at the tunnel oxide-nitride interface and at the bulk trapping centers in the nitride layer. The equivalent oxide thickness (EOT) of the SONOS memory cell gate-insulator stack typically determines the program and erase voltage levels of the device. The program/erase speed, and especially, the erase speed and charge retention are strongly influenced by the tunnel oxide thickness. The logic window between the logic "1" and the logic "0" memory states (Vt"1"-Vt"0") is generally dependent on the trapped charge density at the interface and in the bulk of the nitride and consequently increases with increasing thickness of the nitride. Due to the high field requirements of the charge transport through the tunnel oxide and the relatively low density of deep energy traps in the nitride, the a) voltage scalability, b) program/erase speed, and c) magnitude of the logic window are generally limited with the SONOS device ONO insulator stack when an industry standard minimum of ten years of charge retention is required. This is especially true if programming voltage levels are to be scaled.

Regardless of the mechanisms of charge transport employed (CHE, Hot Hole, or Fowler-Nordheim Tunneling), floating gate memory cells are even more limited in voltage scalability and speed compared to SONOS. This is due to the fact that the EOT of such device gate-insulator stacks are required to be nearly twice that of a SONOS device and the tunnel oxide thickness is two to four times as thick when compared to those of the SONOS device to be able to ensure ten years of charge retention. Floating gate Flash devices typically employ oxide as the tunnel layer media and a thicker ONO stack on top of the polysilicon floating gate as the charge blocking layer.

For a single transistor memory cell of either Floating gate type or SONOS type, the control gate acts as both the "read" or "addressing" gate and the gate that controls the operation of programming and erase. During "read" operation, conductance of the memory cell FET determines the read speed of the device, which in turn typically depends on the transconductance and channel width/length (W/L) ratio of the device. During the standby state, device leakage depends on short channel effects and the stability of the memory states. High voltage requirements and hot carrier induced degradation of tunnel oxide adversely affect read speed and read disturb, as well as device leakage, as mentioned above.

As the channel length in conventional field effect transistors and floating gate/node memory cells are reduced in length, the devices begin to be adversely affected by what has been called the short channel length effect. With the short channel length effect, as the channel is reduced in length, the distance between the source and drain regions is decreased and the impurity diffusions that form the source and drain regions begin to merge under the device in the channel region. This has the effect of changing the device into a depletion mode device, where a channel of minority carriers is already formed in the channel region under the device and the device conducts current without the application of a voltage on the control gate. This leakage current through unselected devices can corrupt data reads on the common bit lines unless the device is isolated or driven with a voltage to force it to turn off. Eventually the short channel effect, with shorter and shorter channels, can progress to the point where the device cannot be shut off, destroying the ability of the control gate to modulate the conductance of the device (it acts more and more as a resistor) and destroying it as a non-linear device. The short channel effect is typically not seen in dual gated transistors or memory cell FETs, due to the thin channel body of the device and incident top and bottom fields.

As stated above, both the high voltage requirements and higher leakage currents associated with the programming (write/erase) of the current generation of flash technology have begun to adversely affect endurance, reliability, power and speed of operation of the resulting devices and limit scalability. The high programming and erase voltages apply high fields across the gate insulator stack typically cause gate insulator oxide degradation. This gate insulator oxide degradation impacts device non-volatility (charge retention) and limits the overall device endurance (the number of program/erase cycles possible before failure). The high fields also severely limit the amount the device feature geometry can shrink beyond the current generation due to cell to cell isolation and design requirements. The high programming voltages are also known to induce a strong capacitive cross-coupling between a selected bit and adjacent unselected bits with the same word line (or bit line) or between adjacent worldliness or bit lines. This cross-coupling has become a critical issue in the overall memory device speed and scaling. Cross-coupling issues typically increase as voltage levels are increased or as the memory device features are scaled smaller without there being a commensurate reduction in voltage levels.

As stated above, typical SONOS floating node memory cell devices, unlike floating gate devices, hold charges in discrete traps associated with a nitride trapping layer. The equivalent EOT of the central ONO insulator stack for such devices can be as low as about half that of floating gate device and, therefore, the programming voltage level for a SONOS device is about half of that of an equivalent floating gate device. However, further voltage and feature scaling for SONOS devices are limited without it adversely affecting charge retention (due to leakage and back-tunneling) and speed (which is typically tunnel oxide thickness dependent) and logic window (which is typically nitride trapping layer thickness dependent). Even though SONOS devices may operate by tunneling for both write and erase, the peak field across the tunnel oxide can still be very high (typically 10

MV/cm) causing the associated high field degradation of the tunnel oxide, adversely affecting endurance and reliability.

Because of the above stated reasons, oxide-based non-volatile memory cell devices, such as traditional Flash, SONOS, or Nano-crystal memory cells are limited in voltage, power, speed, and feature scalability. Additionally, because of the high fields required across the oxide insulation layers, such oxide-based devices are also limited in reliability and endurance.

Dual gate and Back-side gate devices, because of their structure, sandwich a (typically thin) body region between two gate stacks (the top and bottom gate stacks). This thin body transistor structure prevents short channel effect by limiting the channel body thickness and the available body charge. In addition, dual gate devices have been utilized in fast logic devices because of their improved channel conductance (due to twin minority channel carrier regions being formed at both the top and bottom of the channel body) and reduced capacitance thereby enhancing switching characteristics. As a result of these properties, dual gate/back-side gate devices can typically be scaled further while exhibiting better performance characteristics than single gate devices.

Back-side gate memory cell embodiments of the present invention utilize band-gap engineered gate-stacks that allow low voltage program and erase of the memory cells via the direct tunneling of carriers to or from the trapping layer held above or below the channel in the charge trapping gate stack. The band-gap engineered charge trapping gate stack of embodiments of the present invention incorporate tunnel insulator layers having asymmetric tunnel barriers and one or more layers of direct tunnel insulator layers of increasing conduction band offset (each following tunnel layer has a higher conduction band energy level than the previous layer) and increasing values of K (dielectric constant) to provide very high electron current density during programming at reduced voltage drop across the direct tunnel layers. The combination of deep charge trapping centers and asymmetric tunnel barriers of increasing band offset provides large reverse tunneling barrier to promote the required charge retention. In embodiments of the present invention, appropriate selections of charge trapping material and embedded nanocrystals facilitate a desired Vt shift for minimum adequate logical state/logical window separation. In addition, in embodiments of the present invention, the dielectric constant values of the gate stack layers help minimize the EOT of the gate insulator stack. This enables a gate stack EOT in the range of 2 nm to 6 nm to allow for low voltage operation and speed. Such methods of direct tunnel programming and erasure utilizing band-gap engineered asymmetric tunnel layers are detailed in U.S. Pat. No. 7,612,403, titled "LOW POWER NON-VOLATILE MEMORY AND GATE STACK," issued Nov. 3, 2009, U.S. Pat. No. 7,279,740, titled "BAND-ENGINEERED MULTI-GATED NON-VOLATILE MEMORY DEVICE WITH ENHANCED ATTRIBUTES", issued Oct. 9, 2007, and U.S. Pat. No. 7,402,850, titled "BACK-SIDE TRAPPED NON-VOLATILE MEMORY DEVICE," issued Jul. 22, 2008, which are commonly assigned.

As stated above, in direct tunneling of carriers, the carriers are quantum mechanically tunneled into the trapping layer under low energy conditions. To overcome limitations of reverse direct tunneling operation (seen as charge leakage from the device), the gate-stack of the embodiments of the present invention utilizes one or more layers of material that are band-gap engineered with increasing band-gap offsets and high K values to form an asymmetric band-gap tunnel insulator layer. This asymmetric band-gap tunnel insulator layer is very efficient in charge transport in one direction and yet becomes very retarded in the reverse transport direction, presenting a large barrier. The asymmetric band-gap tunnel insulator layer allows for a low voltage direct tunneling to the trapping layer of the device when a programming field is applied across it utilizing the stepped internal fields of the one or more band-gaps of the asymmetric band-gap tunnel insulator layers, while the same stepped band-gap offsets and high K dielectrics present a large band-gap and consequently large energy barrier to the charges so trapped to prevent back-tunneling and maintain the required long term charge retention.

Because of this direct tunneling programming and erasure, embodiments of the present invention provide a non-volatile memory cell having a charge trapping gate insulator stack with a low overall EOT, allowing them to be operated at very low power and at low programming voltage. The low voltage program and/or erase operations of embodiments of the present invention also reduce damage in the material of the device due to the tunneling/injection of carriers through the insulator layers (the injected carriers are "cool" and never gain enough energy to affect the lattice or material bonds). In addition, embodiments of the present invention allow for improved scaling by allowing the memory to employ smaller effective oxide thicknesses (EOT) and low voltage layout and design in the array and support circuitry of the resulting memory device. The band-gap engineered tunneling medium of embodiments of the present invention consists of one or more layers of direct tunnel layers of increasing conduction band offset (each following tunnel layer has a higher conduction band energy level than the previous layer) and increasing values of K (dielectric constant) to provide very high electron current density during programming at reduced voltage drop across the direct tunnel layers, allowing for high speed, low power programming.

For a dual gate or back-side gate non-volatile memory cell, the charge blocking layer and tunnel layer placement are positioned in the charge trapping gate-insulator stack such that the tunnel insulator is positioned adjacent the channel body and is located between it and the floating node/trapping layer, and the charge blocking layer is between the gate/substrate and the trapping layer. In this arrangement, charge transport takes place primarily between the channel and the trapping layer (floating node) of the charge trapping gate stack during programming and erasure. In programming operation, the stepped band-gap arrangement facilitates direct tunneling of electrons layer to layer from the channel to the trapping layer with a low applied field. After tunneling to the trapping layer, the combined asymmetric stepped energy barriers, long back tunnel distance, and optional deep level charge traps act to reduce charge leakage to the substrate and provide adequate charge retention for non-volatile usage. A high K charge blocking layer is also integrated in the charge trapping gate-stack between the trapping layer and the control gate for one embodiment of the present invention to maintain low charge leakage to the control gate from the trapping layer and at the same time to provide low EOT for the gate-insulator stack.

In another embodiment of the present invention, nano-crystals are embedded in a trapping layer which contains deep high density traps to provide a large trapped charge density, enhancing logic level separation and increasing stored charge, while minimizing the adverse effects of coulomb blockade and quantum confinement. The use of deep traps and/or nano-crystals further increase charge retention by providing deep quantum wells at the trapping layer, further increasing the potential barrier that the trapped charges must overcome to escape from the trapping layer or back-tunnel through.

During read operations in a front-side or back-side charge trapping dual-gate non-volatile memory cell, the non-charge trapping gate stack or access gate is typically active and asserts a field to generate a channel of minority carriers in the channel body region, operating the access gate stack as a conventional FET. The (front-side or back-side) charge trapping gate stack is typically inactive during reads, aside from the field asserted by the charge trapped on the trapping layer on carriers in the channel.

Programming a front-side or back-side charge trapping dual-gate non-volatile memory cell embodiment of the present invention is accomplished by providing a voltage across the channel to the charge trapping gate stack to apply a field across the one or more tunnel layers and induce direct tunneling of electrons from the channel to the trapping layer of the bottom gate stack.

In multi-bit memory cell programming, multiple data bits are encoded into a memory cell usually via either multiple charge centroids stored in the trapping layer or by modulating the threshold voltage level to encode the stored data bits. In threshold voltage modulated multi-bit storage, also known as multi-level cell (MLC) storage, differing threshold voltage levels are utilized to encode the data values stored in the memory cell, thus making a large logic window separation in the memory cell advantageous. The memory cell is then read by sensing the threshold voltage the memory cell activates at. In charge centroid multi-bit storage, the voltage is applied between a selected source/drain region (with front-side or back-side trap memory cell operating with the selected source/drain region acting as a source and the second source/drain region acting as the drain) and the back-side gate/substrate, tunneling electrons to the trapping layer directly adjacent to the selected source/drain region. The memory cell is then read by reversing the operational function of the first and second source/drain regions (the selected source/drain region acting as the drain and the second source/drain region acting as the source).

Erasure in memory cell embodiments of the present invention is also accomplished by direct tunneling of holes and by enhanced Fowler-Nordheim tunneling of electrons from the trapping sites. An erase voltage is applied across the tunnel layers from the channel to the control gate of the charge trapping gate stack, applying a field across the one or more tunnel layers and inducing direct tunneling of holes from the channel body and Fowler-Nordheim tunneling of electrons from the trapping layer of the gate-stack to the channel to erase the memory cell. The erasure operation is relatively slower than the corresponding direct tunnel write operation, due to the asymmetric tunnel barrier and/or the higher effective mass of holes. The relatively slower erase, however, can be offset by utilization of a block erase operation, where a large block of bits is erased in parallel.

It is also noted that the erase speed of the dual or back-side gate memory cell erasure of embodiments of the present invention can also be accomplished by or enhanced by a combination of conventional hot-hole injection, enhanced Fowler-Nordheim electron tunneling, or by enhanced Fowler-Nordheim tunneling of holes from the charge trapping layer control gate/substrate. It is further noted that other manners of operating front-side and back-side trap dual-gate non-volatile memory cells for reading, programming and erasure are possible and will be apparent to those skilled in the art with the benefit of the present disclosure.

It is also noted that the appropriate selection of control gate passivation layers as well as band engineered charge blocking and tunnel layers can be utilized to enhance erase speed through simultaneous hole injection from the control gate during erase operation. Such method of memory cell erasure through hole injection is detailed in U.S. Pat. No. 7,279,740, titled "BAND-ENGINEERED MULTI-GATED NON-VOLATILE MEMORY DEVICE WITH ENHANCED ATTRIBUTES", issued Oct. 9, 2007, and U.S. Pat. No. 6,784,480, titled "ASYMMETRIC BAND-GAP ENGINEERED NONVOLATILE MEMORY DEVICE," issued Aug. 31, 2004, both of which are commonly assigned.

This programming and erasure by the transport of electrons and holes by direct tunneling allows embodiments of the present invention to consume orders of magnitude lower power compared to conventional flash memory cells and devices. Writing and erase speed are significantly enhanced as electrons and holes tunnel directly from one direct tunnel layer into the next through successive layers of low barrier energy.

As stated above, the tunnel insulation layer region of embodiments of the present invention may consist of one or more layers of dielectric material with increasing conduction band offsets and/or increasing dielectric K values, allowing directionally asymmetric direct tunneling efficiency of carriers through the tunnel layer. The layers of dielectric material can be selected from any commonly utilized insulator materials (oxides, mixed oxides, nitrides, or silicates) so long as they are arranged in increasing band-gap offsets and, preferably, higher K dielectric materials to help reduce the EOT of the resulting memory cell. Examples of these insulator materials include, but are not limited to, silicon dioxide ($SiO_2$), titanium dioxide ($TiO_2$), hafnium oxide ($HfO_2$), zirconium oxide, Praseodymium Oxide ($Pr_2O_3$), alumina ($Al_2O_3$), mixed oxide hafnium and aluminum, mixed oxide of hafnium and titanium, etc, silicon oxynitride (SiON), SiN, AlN, HfN, etc. These layers of increasing band-gap offset dielectric material are typically deposited during manufacturing processing utilizing atomic layer deposition (ALD) or other appropriate deposition processes.

For example, the tunnel layer region may be a composite of one or more mono layers of $SiO_2$ (band gap 9 eV, K=3.9), formed over the channel region, followed by one or more mono-layers of silicon nitride (SiN, band offset 1.03 eV, K=7) or alumina ($Al_2O_3$, band offset: 4.5 eV, K=10) to be followed by one or more mono-layers of $HfO_2$ (band offset: 1.65 eV, K=24) or $Pr_2O_3$ (band offset: 1.9 eV; band gap 3.9 eV; K=30) or $TiO_2$ (band offset 3.15 eV; K=60) for a three layer tunnel layer structure. A two-layer tunnel structure can consist of $SiO_2/Pr_2O_3$ or $SiO_2/TiO_2$, $SiO_2/HfO_2$, etc. It is noted that other two, three, or more layer asymmetric band-gap tunnel regions of embodiments of the present invention are also possible and will be apparent to those skilled in the art with the benefit of the present disclosure, and as such the above examples should not be considered as limiting.

It is also noted that, in one embodiment of the present invention, the successive layers of the asymmetric band-gap tunnel layer not only have increasing band offsets, but also have material of higher K values and increased direct tunnel thickness to minimize the effective EOT of the tunnel layer composite and optimize voltage drop across the each of the tunnel layers. In embodiments of the present invention, the physical thickness of the composite tunnel layer can be preferably designed to be around 3 nm or less and the EOT around 1.5 nm or less for low voltage operation. For example, a typical tunnel layer may consist of 0.8 nm of $SiO_2$+1 nm of SiN+1 nm of $HfO_2$ (EOT=1.6 nm) or 0.8 nm of $SiO_2$+1 nm of $HfO_2+1.5$ nm of $Pr_2O_3$ (EOT=1.3 nm) or 0.8 nm of $SiO_2+1$ nm of $HfO_2+2$ nm of $TiO_2$ (EOT=~1.2 nm).

In order to improve retention and charge density, metal nano-crystal memory devices have been utilized that contain certain metal or semiconductor nano-dots or nano-crystals including, but not limited to, tungsten, silicon, germanium, cobalt, platinum, gold, and palladium to provide deep energy trapping sites at the metal-insulator interface due to large work function difference. However, such devices require adequate dot size and dot separation to ensure effective retention of trapped charges due to quantum confinement effect (to prevent electrons from tunneling between adjacent trapping sites within the trapping layer or tunneling back to silicon). In addition, coulomb blockade (where like charges repel each other) could further degrade charge retention, such that, in design, multiple charge trapping per nano-dot should be avoided.

If coulomb blockade is minimized such that effectively a single electron is captured for every available nano-dot trapping site and the nano-dot size and separation are selected to reduce the adverse effects of quantum confinement, the effective charge trapping density of nano-dot trapping layer is limited to around $1E12/cm^2$ to $2E12/cm^2$ regardless of the actual density of nano-dots. Consequently, the effective charge trapping density for conventional nano-dot or nano-crystal devices is limited. This effective charge trapping density limitation can be overcome if a favorable geometry and distribution of nano-crystals were embedded in insulating trapping layers that also contained a high density of naturally occurring deep traps, such as SiN, AlN, or SiON. If this trapping layer is also formed of high K material, the EOT of the entire gate-stack would also be reduced.

The above concept is utilized for the trapping medium in one embodiment of the invention. In this approach, the trapping medium may consist of an appropriate thickness of an insulator having a large number of naturally occurring trap sites, such as silicon oxynitride (SiON, trap depth: Et>1.2 eV, refractive index ~1.8, K=7) or $HfO_2$ (trap depth: Et=1.5 eV, K=24), silicon nitride ($Si_3N_4$, trap depth: Et=1.0 eV, refractive index=2.0, K=7), silicon-rich silicon nitride, aluminum nitride (trap depth>1.0 eV) or $TiO_2$ (trap depth: Et=0.9 eV; K=60). The trapping medium is then embedded with nano-crystals/nano-dots that include, but are not limited to, tungsten, silicon, germanium, cobalt, platinum, gold, or palladium in sizes ranging from 1.5 nm to 4 nm with a separation of 3.5 nm to 5 nm to further increase the number of trapping sites.

As stated above, the silicon oxy-nitride (SiON) utilized in the above example provides additional charge trapping sites. The nitrogen-rich SiON has an atomic silicon concentration of approximately 38%-40%, an atomic oxygen concentration of approximately 20%, and an atomic nitrogen concentration of approximately 40%, resulting in a trapping layer with a dielectric constant of approximately 7, refractive index of approximately $\gamma=1.8$, a band-gap of approximately 5.5 eV to 5.7 eV, and a charge trap density of 8E12-1E13/cm2, with a trap depth of approximately 1.7 eV. In the above SiON, deep energy traps are associated with larger concentrations of Si—O—N bond "defects" in the silicon oxy-nitrides. Such a trapping layer of an embodiment of the present invention would provide an effective charge density in the desired range of $5E12/cm^2$ to $1E13/cm^2$ without the adverse effects on retention due to coulomb blockade or quantum confinement. It is noted that other charge trapping insulator materials may also be utilized in embodiments of the present invention as the charge trapping layer. Such a nitrogen-rich SiON trapping layer can also be combined with a oxygen-rich silicon oxy-nitride, SiON, (refractive index of approximately $\gamma=1.55$, band-gap 7.3 eV, and K=5) tunnel layer to provide an asymmetric tunnel barrier in a single layer. The oxygen-rich silicon oxy-nitride (SiON, with refractive index of approximately $\gamma=1.55$) has an atomic oxygen concentration of $>=46\%$, while its atomic silicon concentration is $<=33\%$.

For one embodiment of the present invention, the charge blocking layers are preferably comprised of a single or composite layer of large K dielectric material layers such as $Al_2O_3$ (K=10) or HfSiON (K=17) or $Pr_2O_3$ (K=30) or $TiO_2$ (K=60) of thickness greater than 6 nm, to provide a large electron energy barrier and prevent direct tunneling of trapped charges to the control gate while helping minimize the overall EOT of the gate-stacks. As stated above, charge blocking layers have been disclosed that allow for erasure of the data stored in the trapped charge on the trapping layer of the memory cell by allowing the tunneling or injection of hole or electron carriers through the charge blocking layer from the control gate. It is noted, however, that multiple insulators can be utilized in charge blocking layers of embodiments of the present invention, including, but not limited to insulators from the oxide, mixed oxide, nitride, and silicate families.

The access gate and back-side gate/substrate of embodiments of the present invention typically has a thin passivating conductive underlayer of HfN, TiN, or TaN (for process integration) over the gate. The access gate and back-side gate/substrate (if a separate material and not formed from the substrate) typically comprises either a polysilicon gate or any other appropriate metal gate (such as aluminum or tungsten) formed over the charge blocking layer of the gate-stack.

The total EOT for a gate-stack of an embodiment of the present invention made with the above materials and specifications will typically range from EOT=2.5 nm to EOT=6.5 nm with physical thickness ranging (excluding the control gate electrode thickness) from 10 nm and upward, have a programming voltage as low as 1.5V, and an average field as low as $1.0E6V/cm^2$. This allows memory cells and devices of embodiments of the present invention to provide voltage scalability and low power consumption levels not available in other current memory devices.

Figure 1E:
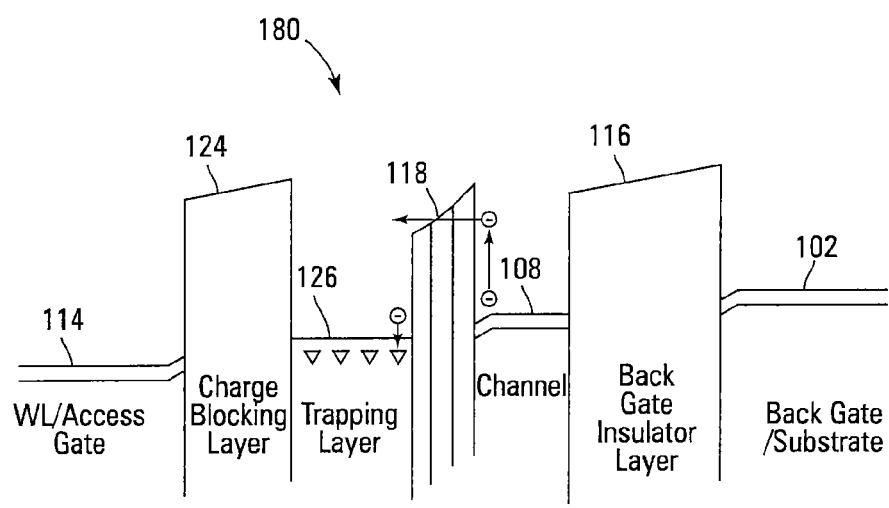
Figure 1F:
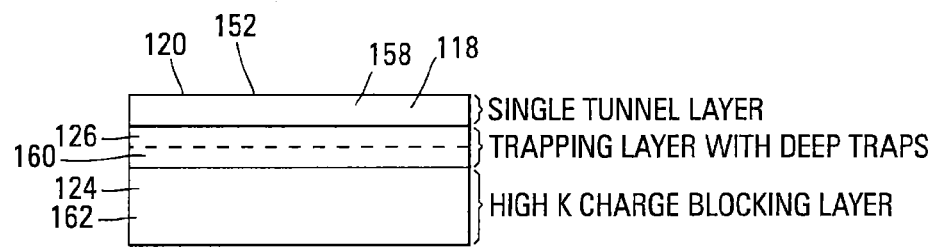
Figure 1G:
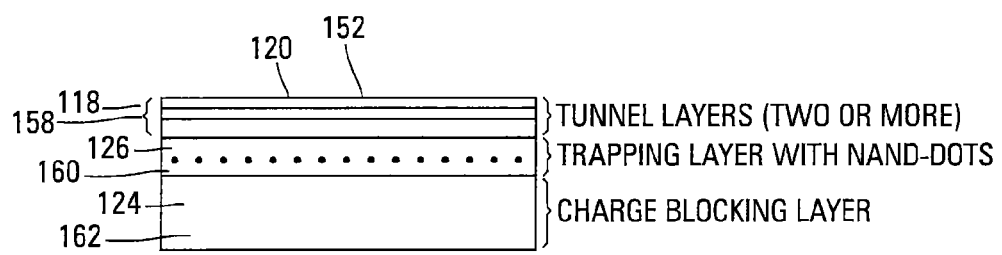

FIGS. 1A-1C detail physical cross sections of both a bulk silicon implementations 100, 130 and a silicon-on-insulator (SOI) implementation silicon-on-nothing (SON) 140 of the dual gate or back-side gate non-volatile device structures in both front-side 100 and back-side 130, 140 charge trapping designs in accordance with embodiments of the present invention. FIGS. 1F and 1G illustrate examples of gate-insulator stacks for the charge trapping gate-insulator stack 120, 152 of embodiments of the present invention. FIGS. 1D and 1E detail the corresponding band-gap diagram of a front-side trap dual gate memory cell 100 and a back-side trap dual gate memory cell 130, 140 in accordance with embodiments of the present invention.

In FIG. 1A, a bulk front-side trap dual-gate NFET memory cell 100 is shown formed on a substrate 102. The memory cell 100 has a first and second source/drain regions 104, 106, in contact with a thin or thick body channel region 108. A top or front-side gate-stack 110 is formed over the silicon body channel region 108, and a bottom or back-side gate-stack 112 is formed under the channel region 108. In the back-side gate-stack 112, the back-side control gate or access gate 122 is formed as a bulk back-side control gate from the substrate 102, which may either be a bulk or silicon-on-insulator (SOI) substrate. The access gate region 122 of the back-side gate-stack is isolated from the body channel 108 by a gate insulator layer 116 formed between the back-side gate 122 and the channel region 108. The insulator stack 120 of the front-side gate-stack 110 contains a tunnel insulator layer 118 formed over the channel region 108, a trapping layer 126 formed over the tunnel layer 118, a charge blocking layer 124 formed over the tunnel layer 118 and a control gate 114 formed over the charge blocking layer 124. The tunnel insulator layer 118 includes one or more layers of materials layered to provide an asymmetric stepped band-gap profile with the channel 108 and the trapping layer 126. The trapping layer 126 may also be optionally provided with deep traps and embedded metal nano-crystals. The front-side gate-stack 110 and back-side gate-stack 112 may also contain optional passivation layers formed between the control gate 114 and the charge blocking layer 124 or the back-side control gate 122 and the insulator layer 116, respectively.

In FIG. 1B, a bulk back-side trap dual-gate NFET memory cell 130 is shown formed on a substrate 102. The memory cell 130 has a first and second source/drain regions 104, 106, in contact with a thin or thick body channel region 108. A top or front-side gate-stack 110 is formed over the body channel region 108, containing an access gate 114 isolated from the body channel 108 by a gate insulator layer 116. A bottom or back-side gate-stack 112 is formed under the channel region 108. In the back-side gate-stack 112, the back-side control gate 122 is formed as a bulk back-side gate from the substrate 102, which may either be a bulk or silicon-on-insulator (SOI) substrate. The insulator stack 120 of the bottom gate-stack 112 contains a charge blocking layer 124 formed over the substrate 102 as a bulk back-side control gate 122, a trapping layer/floating gate 126 formed over the charge blocking layer 124, and a tunnel insulator layer 118 formed over the trapping layer 124, directly under the channel region 108. The tunnel insulator layer 118 includes one or more layers of materials layered to provide an asymmetric stepped band-gap profile with the channel 108 and the trapping layer 126. The trapping layer 126 may also be optionally provided with deep traps and embedded metal nano-crystals. The front-side gate-stack 110 and back-side gate-stack 112 may also contain optional passivation layers formed between the access gate 114 and the insulator layer 116 or the back-side control gate/substrate 122 and the charge blocking layer 124, respectively.

Multiple layers of single crystal semiconductor films can be deposited over bulk silicon substrate, as well as over SOI substrates. For example, a layer of appropriate thickness germanium can be deposited over a silicon substrate to be followed be another layer of epitaxially grown silicon. By a combination of lithographic patterning and selective etching of underlying germanium films, selective localized voids can be formed underneath the top silicon film. This technique was developed by M Jurezak et al. VLSI Tech. Digest p. 29, 1999, and is called silicon-on-nothing or SON. Recently R. Ranica et al. built and characterized PMOS back-side trapped SONOS memories by depositing ONO layers on SON (R. Ranica et al., IEEE Silicon nanoelectronic workshop, p. 99, 2004). The present invention applies similar techniques in bulk silicon and SOI to create novel silicon-on-nothing (SON) dual-gate non-volatile memory cells.

For another embodiment of the present invention, a dual-gate front-side or back-side trap non-volatile memory cell comprises a first and second source/drain regions formed over the buried oxide (BOX) region of an SOI substrate. The control gate and underlying trap-free insulator of the non-trapping gate-stack is formed adjacent to the thing-body p-type silicon similar to a fully depleted SOI-NFET device. On the opposite side of the thin floating body channel, an ONO replacement charge trapping gate-insulator stack and control gate are formed. The back-side gate may consist of heavily doped N+ or P+ polysilicon or metal. The charge trapping ONO replacement layer consists of a charge block-ing layer formed adjacent the control gate of the charge trapping gate-stack, a trapping layer formed adjacent the charge blocking layer, and one or more sub-layers of tunnel insulator formed adjacent the trapping layer and interfacing the thin floating body channel region. The back-side gate and back-side gate-insulator stack are formed in a similar manner of silicon-on-nothing (SON) implementation as outlined by the reference of R. Ranica et al. The tunnel insulator layer may consist of one or more layers of dielectric material of increasing conduction band offset. The thin body implementation, as described above, provides immunity from short channel effects and aids in further feature size reduction.

In FIG. 1C, a silicon-on-insulator (SOI) silicon-on-nothing (SON) back-side gate NFET memory cell 140 is shown formed on a substrate 142 and box 170 utilizing a silicon-on-nothing (SON) design. Silicon-on-nothing (SON) design forms a void 164 within a part of the floating body (P-silicon/germanium) of the device 172 to reduce the effect of substrate parasitics on the resulting circuit element. The memory cell 140 has a first and second source/drain regions 144, 146, in contact with a floating body channel region 148 (which is a part of 172). A top gate-stack 150 is formed over the channel region 148, containing an access gate 154 isolated from the channel by an insulator layer 156. The top gate-stack 150 may also contain an optional passivation layer (not shown) formed between the access gate 154 and the insulator layer 156. A bottom gate-insulator stack 152 is formed under the channel floating body region 148. The bottom gate-insulator stack 152 contains a charge blocking layer 162 formed over a back-side gate 166, a trapping layer/floating gate 160 formed over the charge blocking layer 162. A one or more layer asymmetric band-gap tunnel insulator 158 is formed over the trapping layer 160, directly under the channel region 148. The tunnel insulator layer 158 includes one or more layers of materials layered to provide an asymmetric stepped band-gap profile. The trapping layer 160 may also be optionally provided with deep traps and embedded metal nano-crystals. It is noted embodiments of the present invention utilizing other forms of design and integrated circuit processing designed to reduce the effect of substrate parasitics on the resulting circuit elements, including, but not limited to silicon-on-insulator (SOI) and silicon-on-sapphire (SOS), are known and will be apparent to those skilled in the art with the benefit of the present disclosure. It is also noted that front-side trap versions of the silicon-on-nothing (SON) dual-gate non-volatile memory cell of FIG. 1C are also possible and will be apparent to those skilled in the art with the benefit of the present disclosure.

FIG. 1D details a band-gap diagram 170 of a back-side trap memory cell 130, 140 of FIGS. 1B and 1C in accordance with embodiment of the present invention. In FIG. 1D, the access gate 114, 154 is separated from the body/channel 108, 148 by the access gate insulator layer 116, 156. The trapping layer 126, 160 is separated from the channel 108, 148 by the one or more layers of the asymmetric band-gap tunnel layer 118, 158, and from the back-side gate 166/substrate 102 by the charge blocking layer 124, 162.

FIG. 1E details a band-gap diagram 180 of a front-side trap memory cell 100 of FIG. 1A in accordance with embodiment of the present invention. In FIG. 1E, the back-side gate/substrate 102 is separated from the body/channel 108 by the back-side gate insulator layer 116. The trapping layer 126 is separated from the channel 108 by the one or more layers of the asymmetric band-gap tunnel layer 118, and from the word line/access gate 114 by the charge blocking layer 124.

FIG. 1F illustrates an example of an ONO replacement gate-insulator stack for the charge trapping gate-insulator stack 120, 168 of an embodiment of the present invention. A single oxygen-rich silicon oxynitride 118, 158 (>46 atomic percent oxygen, 20 atomic percent nitrogen, refractive index γ=1.55, K=5) replaces the tunnel oxide with a barrier height of 2.8 eV, compared to 3.2 eV for $SiO_2$, thereby enhancing direct tunnel electron fluence during programming. The trapping dielectric 126, 160 is a layer of nitrogen-rich silicon oxynitride (approximately 40 atomic percent nitrogen, 26 atomic percent oxygen, refractive index of approximately γ=1.8, K=7) which provides higher density (approximately $1E13/cm^2$) deeper traps (trap depth of approximately 1.7 eV compared to a nitride trap depth of approximately 1 eV). The charge blocking layer is replaced by alumina ($Al_3O_5$) 124, 162 which has barriers comparable to $SiO_2$ to electrons and holes and at the same time a K value of approximately 10 compared to $SiO_2$ (K~=4), thereby reducing the overall EOT of the resulting gate-insulator stack. The tunnel oxygen-rich oxynitride (γ=1.55) has the characteristic of very low trap density similar to $SiO_2$ and yet has a significantly lower leakage compared to $SiO_2$ thereby providing improved retention compared to an equivalent ONO gate-insulator stack, the above stack would reduce the EOT by two-thirds (⅔×) and consequently reduce write/erase voltage levels while improving speed, retention and endurance.

FIG. 1G illustrates the details of a relatively more complex example of a charge trapping gate-insulator stack 120, 168 of an embodiment of the present invention containing a more complex tunnel dielectric medium 118, 158, a more complex trapping medium 126, 160, and a high-K charge blocking medium 124, 162. The tunnel media 118, 158 consists of two or more layers of dielectric of increasing conduction band offset and high K values, enabling direct tunnel "barrier thinning" (a shorter effective tunnel distance when field is imposed across the tunnel insulator layer) thereby promoting significantly enhanced electron transport across the layers at reduced fields. The trapping media 126, 160 consists of a high K dielectric layer of intrinsic deep traps of high trap density, aided by enhanced trapping due to embedded high work function nano-dots. The high K charge blocking layer 124, 162 is alumina ($Al_3O_5$) 124, 162 which has barriers comparable to $SiO_2$ to electrons and holes and at the same time a K value of approximately 10 compared to $SiO_2$ (K~=4), thereby reducing the overall EOT of the resulting gate-insulator stack. The EOT of an equivalent gate-insulator stack can be reduced by 30% or more compared to an ONO gate-stack and correspondingly lowers the programming voltage levels.

Many options of ONO replacement may be considered for the charge trapping gate-insulator stack 120, 168, to achieve (a) a lower EOT of the insulator stack, thereby achieving voltage scaling; (b) band engineered asymmetric direct tunneling for electrons and holes to achieve low voltage, low energy high speed carrier transport to the trapping sites and reduce back tunneling of carriers; (c) high density deep energy trapping material to achieve retention and logic window; and (d) high K, large band-gap charge blocking insulator with high barrier energy for electrons and holes, to prevent back injection and charge loss. For (a), (c) and (d) high K insulators are desired to reduce the incident field, thereby improving stack reliability. For high speed carrier transport in the desired direction (item (b)), enhancement of direct tunnel or Fowler-Nordheim tunneling is required. Direct tunneling is enhanced by reducing tunneling distance ("barrier thinning") and by reducing barrier energy while the later enhances Fowler-Nordheim tunneling. Specific examples of which are detailed herein, in the various embodiments of the present invention.

Specifically, in one embodiment, the tunnel insulator layer 118, 158 contains three layers of material, a first layer of 0.5 nm of $SiO_2$ (K=4), having a band-gap of approximately 9 eV adjacent the channel region 108, 148, which has a band-gap of 1.1 eV. A second layer of 1 nm of SiN (band offset 1.03 eV, K=7) or $Al_2O_3$, (band gap: 8.8 eV, K=10) is formed adjacent the first layer of $SiO_2$. And a third layer of 1 nm of $HfO_2$ (band-gap: 4.5 eV, K=24) is formed adjacent the second layer.

The trapping layer 120, 160 is formed of a layer of 5-7 nm of $TiO_2$ (band-gap of approximately 3.15 eV, K=60) with 3.5-4.0 nm of embedded Cobalt nano-dots, having a resulting EOT of nearly 0.3 nm. Alternatively, the trapping layer could be a single layer of aluminum nitride (AlN, K=15) or nitrogen-rich SiON (of refractive index of approximately γ=1.8 and K=7) of appropriate thickness containing deep traps (Et>1.0 eV). The charge blocking layer 122, 162 is formed of 10 nm of $Al_2O_3$, (band gap: 8.8 eV, K=10), HfSiON (band gap: 6.9 eV, K=17), $Pr_2O_3$ (band gap: 3.9 eV, K=30), $TiO_2$ (band gap: 3.15 eV, K=60) with an EOT as low as 0.67 nm. The front-side gate 114, 154 and back-side gate 166 (in embodiments with separate back-side gates) are typically formed of polysilicon, tungsten, iridium, or aluminum and may include an initial passivation layer, such as a thin layer of HfN, TaN, TiN, or $IrO_2$.

In another embodiment, the tunnel insulator layer 118, 158 also contains three layers of material, a first layer of 0.5 nm of $SiO_2$ (K=4), having a band-gap of approximately 9 eV formed adjacent the channel region 108, which has a band-gap of 1.1 eV. A second layer of 1 nm of SiN (band offset 1.03 eV, K=7) or oxygen-rich silicon oxy-nitride, SiON, (refractive index of approximately γ=1.55, band-gap 7.3 eV, and K=5) or $Al_2O_3$, (band gap: 8.8 eV, K=10) is formed adjacent the first layer of $SiO_2$. And a third layer of 1.5 nm of $HfO_2$ (band-gap: 4.5 eV, K=24) is formed adjacent the second layer. The effective oxide thickness (EOT) of these three layers could be as low as 1.32 nm. The oxygen-rich silicon oxy-nitride (SiON, with refractive index of approximately γ=1.55) has an atomic oxygen concentration of >=46%, while its atomic silicon concentration is <=33%. The corresponding nitrogen-rich silicon oxy-nitride (SiON, with a refractive index of approximately γ=1.8) has an atomic oxygen concentration of <=25%, while the atomic nitrogen concentration is approximately 40%.

The trapping layer 120, 160 is formed of a layer of 6 nm of $HfO_2$ with 3.5-4.0 nm of embedded Cobalt nano-dots, having a resulting EOT of 0.3 nm. The charge blocking layer 122, 162 is formed of 10 nm of $TiO_2$ (K=60) with an EOT of 0.67 nm. And the front-side gate electrode 114, 154 and/or back-side gate electrode 166 is formed of 10 nm of TiN as a passivation layer and doped polysilicon.

It is noted, as detailed above, that multiple insulators can be utilized in tunnel layers of embodiments of the present invention, including, but not limited to insulators from the oxide, mixed oxide, nitride, and silicate families.

As previously stated, the two common types of EEPROM and Flash memory array architectures are the "NAND" and "NOR" architectures, so called for the similarity each basic memory cell configuration has to the corresponding logic gate design. In the NOR array architecture, the floating gate memory cells of the memory array are arranged in a matrix similar to RAM or ROM. The gates of each floating gate memory cell of the array matrix are coupled by rows to word select lines (word lines) and their drains are coupled to column bit lines. The source of each floating gate memory cell is typically coupled to a common source line. The NOR architecture floating gate memory array is accessed by a row decoder activating a row of floating gate memory cells by selecting the word line coupled to their gates. The row of selected memory cells then place their stored data values on the column bit lines by flowing a differing current from the coupled source line to the coupled column bit lines depending on their programmed states. A column page of bit lines is selected and sensed, and individual data words are selected from the sensed data words from the column page and communicated from the memory.

An EEPROM or Flash NAND array architecture also arranges its array of floating gate memory cells in a matrix such that the gates of each floating gate memory cell of the array are coupled by rows to word lines. However each memory cell is not directly coupled to a source line and a column bit line. Instead, the memory cells of the array are arranged together in strings, typically of 8, 16, 32, or more each, where the memory cells in the string are coupled together in series, source to drain, between a common source line and a column bit line. This allows a NAND array architecture to have a higher memory cell density than a comparable NOR array, but with the cost of a generally slower access rate and programming complexity.

A NAND architecture floating gate memory array is accessed by a row decoder activating a row of floating gate memory cells by selecting the word select line coupled to their gates. In addition, the word lines coupled to the gates of the unselected memory cells of each string are also driven. However, the unselected memory cells of each string are typically driven by a higher gate voltage so as to operate them as pass transistors and allowing them to pass current in a manner that is unrestricted by their stored data values. Current then flows from the source line to the column bit line through each floating gate memory cell of the series coupled string, restricted only by the memory cells of each string that are selected to be read. This places the current encoded stored data values of the row of selected memory cells on the column bit lines. A column page of bit lines is selected and sensed, and then individual data words are selected from the sensed data words from the column page and communicated from the memory device.

Figure 2A:
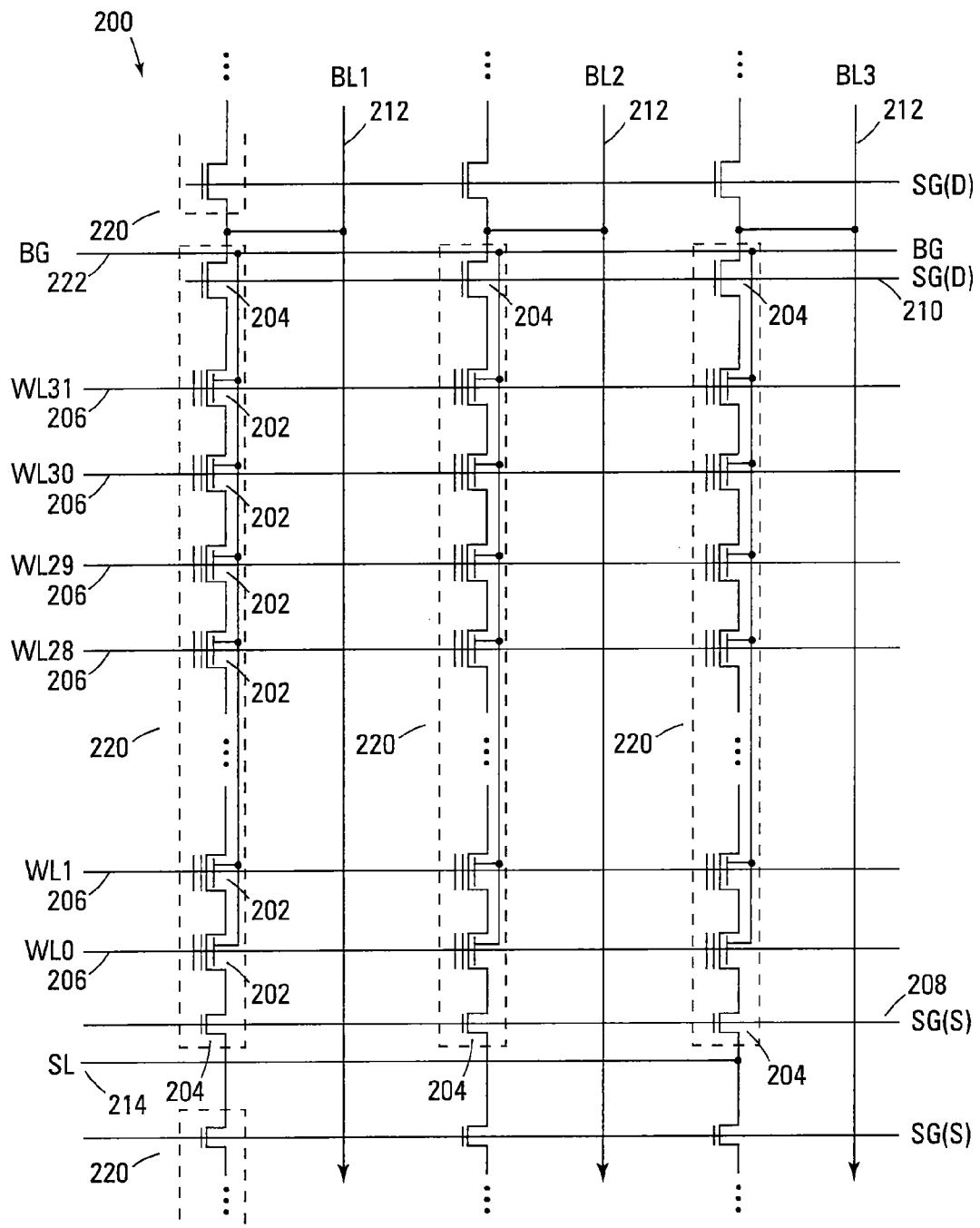
FIGS. 2A-2C detail schematics of a NAND architecture memory array and memory cell strings in accordance with embodiments of the present invention.

FIG. 2A shows a schematic of a simplified NAND architecture floating node or trapping layer memory array 200 of an EEPROM or Flash memory device of an embodiment of the present invention utilizing front-side trap dual-gate memory cells 202 of embodiments of the present invention. It is noted that the NAND architecture memory array 200 of FIG. 2A is for illustrative purposes and should not be taken as limiting and that NAND architecture memory arrays utilizing back-side trap dual-gate memory cells of embodiments of the present invention is also possible and will be apparent to those skilled in the art with the benefit of the present disclosure.

Figure 2B:
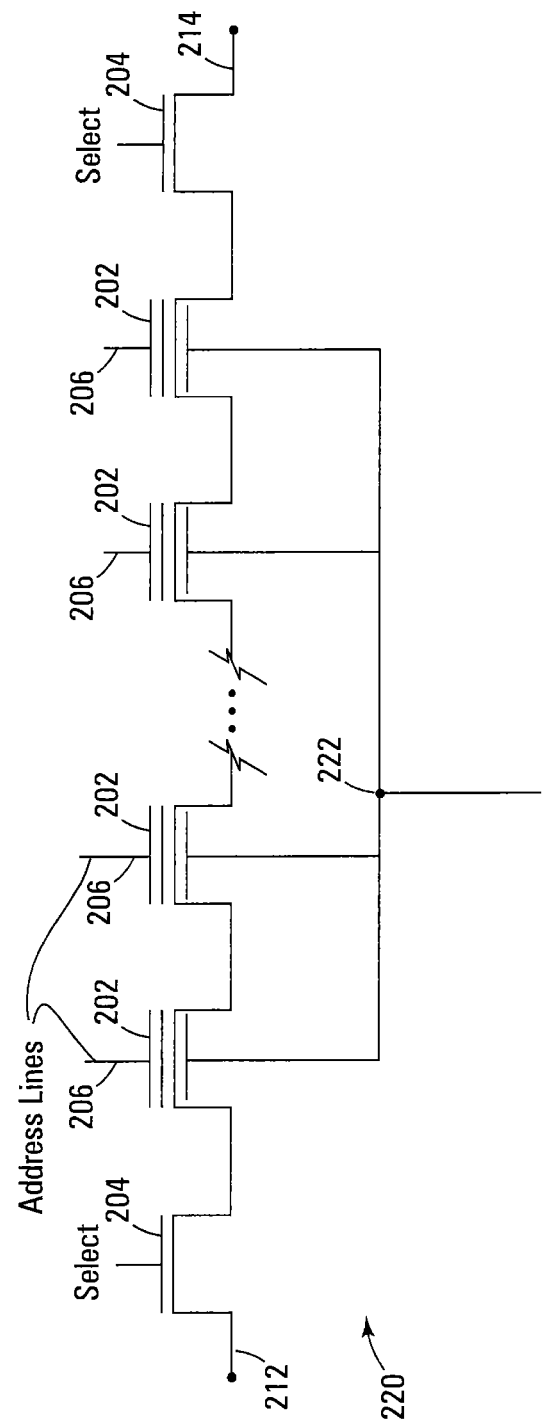

In FIG. 2A, a series of NAND memory strings 220 are arranged in an array 200 and coupled to bit lines 212 and source lines 214. As detailed in FIG. 2B, in each NAND memory string 220, a series of front-side trap dual-gate memory cells 202 of embodiments of the present invention are coupled together source to drain to form the NAND string 220 (typically having 8, 16, 32, or more cells). As described above, each dual-gate memory cell FET 202 has a top or front-side gate-insulator stack formed over the channel region and a bottom or back-side gate-insulator stack formed under the channel region. The front-side gate-insulator stack is made of a composite asymmetric band-gap tunnel insulator layer on top of the thin body channel region, a floating node/trapping layer formed on the tunnel insulator layer, charge blocking insulator layer formed over the trapping layer, and a control gate formed over the charge blocking layer. The back-side gate-insulator stack is made of an insulator layer formed under the thin body channel region on top of the substrate, which takes the place and function of the back-side gate. To further enable this mode of operation, in one embodiment of the present invention, each NAND architecture memory string 220 of memory is formed in an isolation trench, allowing the substrate of each isolation trench to be individually biased for programming and erasure. It is noted that in another embodiment of the present invention, an individual back-side gate can be formed under the charge blocking insulator and coupled to a back-side gate control line. The word lines 206 couple across the NAND strings 220, coupling the control gates of adjacent memory cells 202 enabling a single memory cell 202 in each memory string 220 to be selected. In each NAND memory string 220, N+ doped regions are formed between each gate insulator stack to form the source and drain regions of the adjacent memory cells 202, which additionally operate as connectors to couple the cells of the NAND string 220 together. In one embodiment of the present invention, the N+ doped regions are omitted and a single channel region is formed under the NAND memory string 220, coupling the individual memory cells 202. Each NAND memory string 220 is coupled to select gates 204 that are formed at either end of each NAND floating node string 220 and selectively couple opposite ends of each NAND floating node string 220 to a bit line 212 and a source line 214. The select gates 204 are each coupled to gate select lines, select gate drain {SG(D)} 210 and select gate source {SG(S)} 208, that control the coupling of the NAND strings to the bit lines 212 and source lines 214, respectively, through the select gates 204. In FIGS. 2A and 2B, the back-side gate/substrate connection 222 is shown coupled to the back-side gates of each NAND string 220, allowing the memory cells 202 of each NAND string 320 to be accessed, programmed, and erased. It is noted that, as described above, instead of utilizing the substrate connection 222, individual back-side gate control lines can be formed and utilized to apply programming and erase voltages to a formed back-side gate.

Figure 2C:
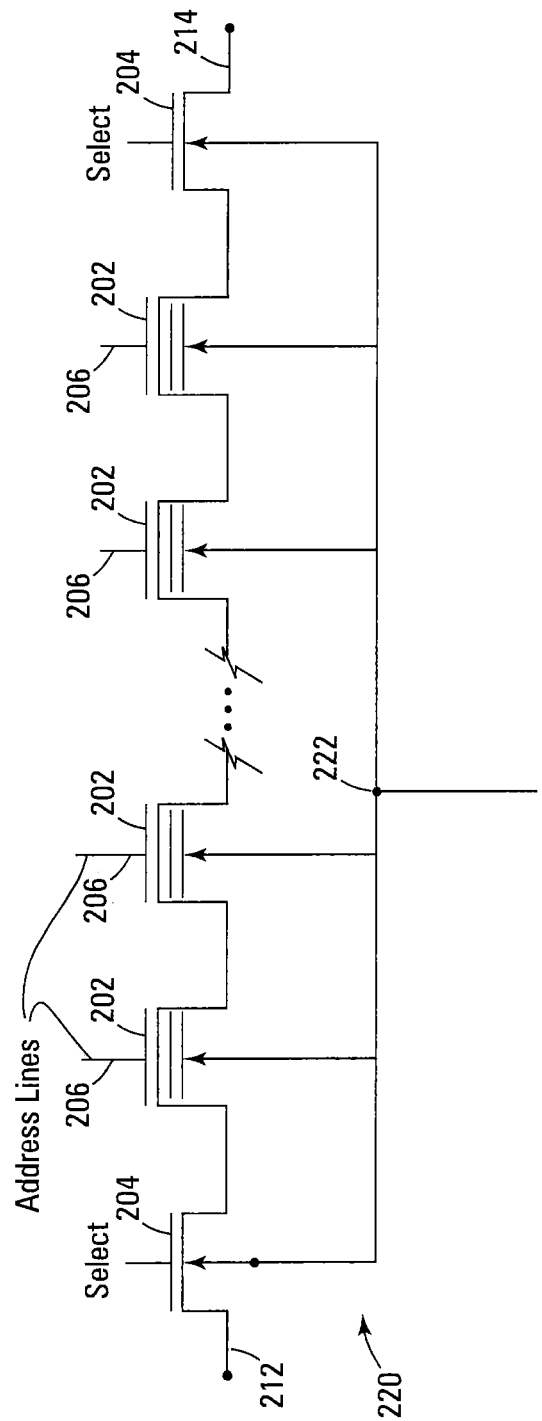

FIG. 2C details a back-side trap NAND memory string 220 of an embodiment of the present invention. In FIG. 2C, a series of back-side trap dual-gate memory cells 202 of embodiments of the present invention are coupled together source to drain to form the NAND string 220. Each dual-gate memory cell FET 202 has a top or front-side gate-insulator stack formed over the channel region and a bottom or back-side gate-insulator stack formed under the channel region. As described above, the back-side gate-insulator stack is made of an asymmetric band-gap tunnel insulator layer having one or more layers formed beneath the channel region, a floating node/trapping layer formed under the tunnel insulator, charge blocking insulator layer formed under the trapping layer on top of the substrate, which takes the place and function of the back-side gate. In one embodiment, each NAND architecture memory string 220 of memory is formed in an isolation trench, allowing the substrate of each isolation trench to be individually biased for programming and erasure. It is noted that in another embodiment of the present invention, an individual back-side gate can be formed under the charge blocking insulator and coupled to a back-side gate control line. The front-side gate-insulator stack is made of an insulator layer formed on top of the channel region and an access gate 206 (typically formed integral to the word line 206, also known as a control gate line) formed over the insulator. In FIG. 2C, the substrate connection 222 is shown coupled to the back-side gates of each NAND string 220, allowing the memory cells of each NAND string 220 to be programmed and erased. It is noted that, as described above, instead of utilizing the substrate connection 222, individual back-side gate control lines can be formed and utilized to apply access, programming, and erase voltages to a formed back-side gate.

In one embodiment of the present invention, for writing a specific cell, the bit line coupled to the selected NAND memory cell string is typically held at a low voltage and the source tied to ground potential. The selected NAND memory cell string to be programmed is selected via activating its select gates. The substrate/control gate of the non-charge trapping gate-stack (the front-side gate in a back-side trap dual-gate non-volatile memory cell NAND string or the back-side gate in a front-side trap dual-gate non-volatile memory cell NAND string) is raised to an appropriate potential to invert the thin body channel region at its gate oxide interface, forming a conductive channel. The control gate of the charge trapping gate-stack for the cell to be written is raised to a programming voltage while all other charge trapping gate-stack control gates are held to either ground or an appropriate voltage level to avoid disturb. Electrons get injected from the thin body channel region to the charge trapping layer, raising the threshold voltage of the selected memory cell. It is noted that in back-side trap dual-gate non-volatile memory cells with back-side control gates formed from the substrate or a back-side control gate that couples across all of the memory cells of the NAND memory cell string, that the non-charge trapping (the front-side) control gate of the selected memory cell can be raised to a programming voltage and utilized to apply a differential programming across the (back-side) charge trapping gate-stack.

A selected dual-gate non-volatile memory cell can be read by raising the relative voltage potential applied to the non-charge trapping gate (the front-side gate in a back-side trap dual-gate non-volatile memory cell NAND string or the back-side gate in a front-side trap dual-gate non-volatile memory cell NAND string) alone or in combination with the raising of the voltage potential on the control gate of the charge trapping gate-stack. The control gates of the charge trapping gate-stacks and/or non-charge trapping gate-stacks of the unselected memory cells of each string are also typically driven, but to a higher gate voltage so as to operate them as pass transistors and allowing them to pass current in a manner that is unrestricted by their stored data values. Current then flows from the source line to the column bit line through each dual-gate non-volatile memory cell of the series coupled string, restricted only by the memory cells of each string that are selected to be read.

For erasing, all the control gates of the charge trapping gate-stack (the back-side gate in a back-side trap dual-gate non-volatile memory cell NAND string or the front-side gate in a front-side trap dual-gate non-volatile memory cell NAND string) in the string are tied to ground or a low voltage and the channel body raised to the erase voltage, tunneling holes to the trapping layer and erasing the memory cells of the NAND memory cell string.

It is noted that other methods of reading, writing, and erasing front-side and back-side trap dual-gate non-volatile memory cells in NAND memory cell string embodiments of the present invention are possible and will be apparent to one skilled in the art with the benefit of the present disclosure.

Figure 3A:
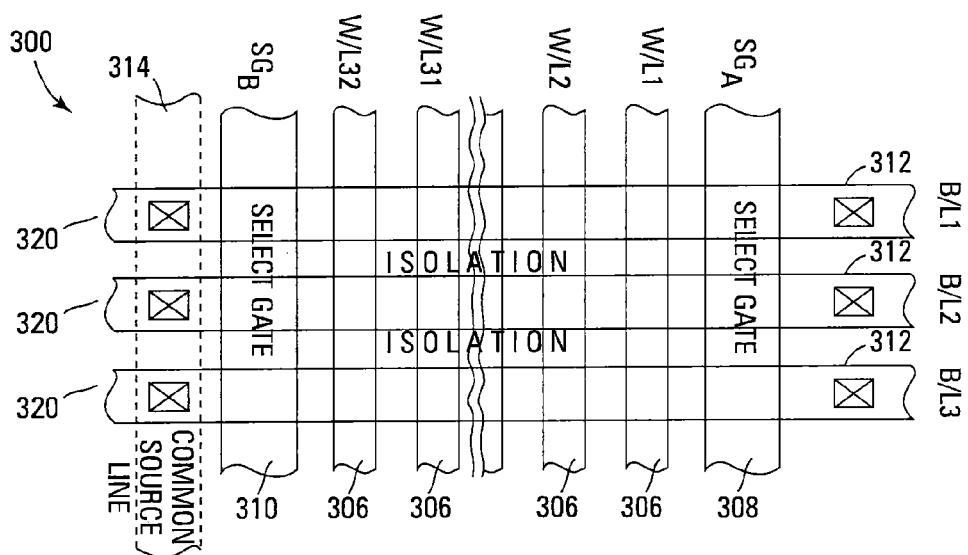
FIGS. 3A and 3B detail a NAND architecture floating gate memory array of the prior art.
Figure 3B:
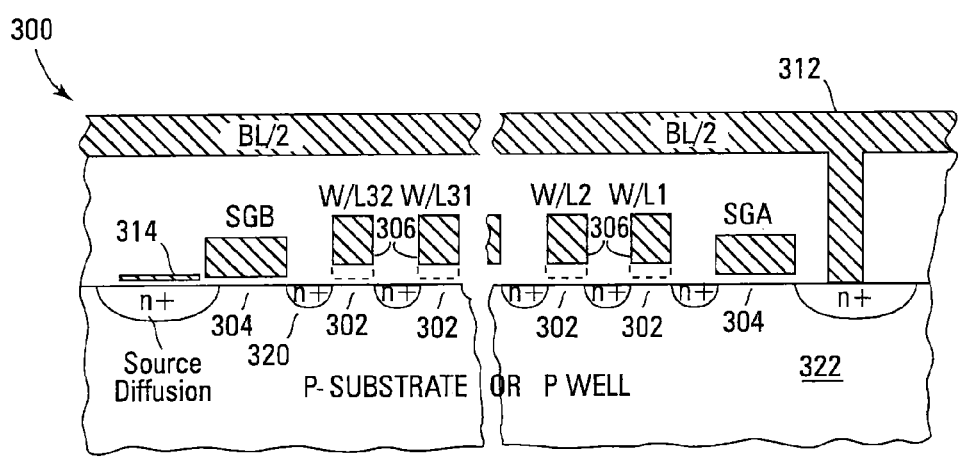

FIGS. 3A and 3B detail a simplified top view and side view of a NAND floating gate memory array of the prior art. FIG. 3A details a top view of a NAND architecture memory array 300 having a series of NAND memory strings 320, a side view of the NAND array 300, detailing a NAND memory string 320 is shown in FIG. 3B. In FIGS. 3A and 3B, a series of floating gate memory cells 302 are coupled together in a series NAND string 320 (typically of 8, 16, 32, or more cells). Each memory cell 302 has a gate-insulator stack that is made of a tunnel insulator on top of a substrate 322, a floating gate formed on the tunnel insulator, an intergate insulator formed over the floating gate, and a control gate 306 (typically formed in a control gate line, also known as a word line) formed over the intergate insulator. N+ doped regions are formed between each gate insulator stack to form the source/drain regions of the adjacent floating gate memory cells, which additionally operate as connectors to couple the cells of the NAND string 320 together. Select gates 304, that are coupled to gate select lines 308, 310, are formed at either end of the NAND string 320 and selectively couple opposite ends of the NAND string 320 to bit lines 312 and source lines 314.

Figure 4A:
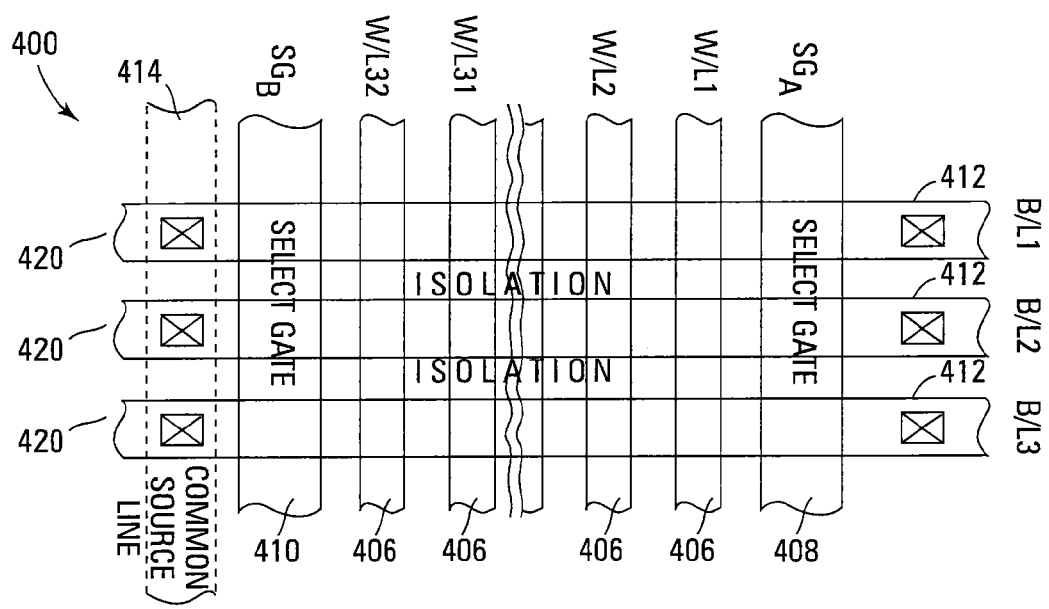
FIGS. 4A and 4B detail a NAND architecture memory array and memory cell strings in accordance with embodiments of the present invention.
Figure 4B:
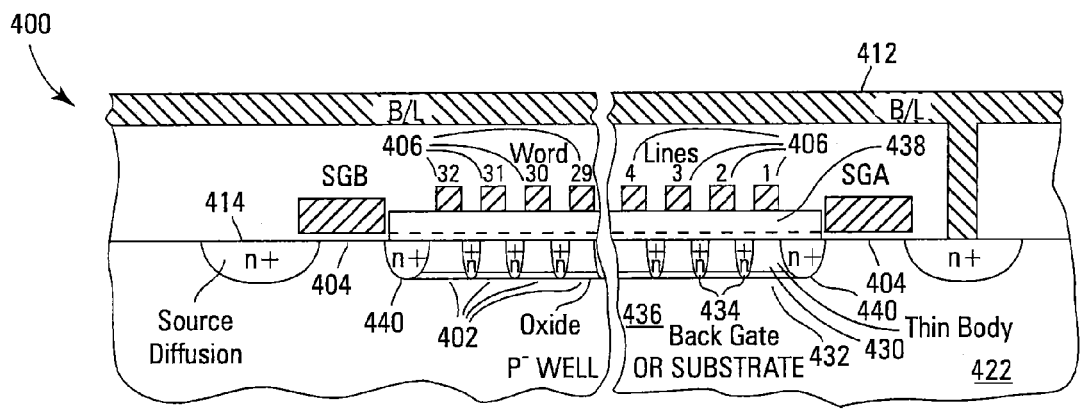

FIGS. 4A and 4B detail a simplified top view and side view of a NAND array of one embodiment of the present invention. FIG. 4A details a top view of a NAND architecture memory array 400 having a series of NAND memory strings 420 of embodiments of the present invention. FIG. 4B details a side cross-sectional view of the NAND array 400, detailing a NAND memory string 420. In FIGS. 4A and 4B, a series of front-side trap dual-gate non-volatile memory cells 402 are coupled together in a series NAND string 420 (typically of 8, 16, 32, or more cells). As described above, each dual-gate memory cell FET 402 has a top or front-side gate-insulator stack 438 formed over the channel region 430 and a bottom or back-side gate-insulator stack formed under the channel region 430. The front-side gate-insulator stack 438 is made of a composite asymmetric band-gap tunnel insulator layer on top of the thin body channel region 430, a floating node/trapping layer formed on the tunnel insulator layer, charge blocking insulator layer formed over the trapping layer, and a control gate formed over the charge blocking layer. The back-side gate-insulator stack is made of an insulator layer 432 formed under the thin body channel region 430 on top of the substrate 422, which takes the place and function of the back-side gate 436. In one embodiment of the present invention, each NAND architecture memory string 420 of memory is formed in an isolation trench, allowing the substrate 422 of each isolation trench to be individually biased for programming and erasure. A word line control gate 406 is formed over the front-side gate-insulator stack 438. The thin body channel region 430 operates to couple the adjacent memory cell 402 of the NAND memory strings 420 together. In one embodiment, optional N+ doped regions 434 are formed in the thin body channel region 430 between each memory cell 402 to form a low resistance serial conducting path between adjacent cells. Select gates 404, that are coupled to gate select lines 408, 410, are formed at either end of the NAND string 420 and selectively couple opposite ends of the NAND string 420 to bit lines 412 and source lines 414. It is noted that the thin body channel region 430 is in contact with the source and drain regions 440 of the select gates 404 to ease formation of a channel of carriers in the thin body channel region 438. It is also noted that in another embodiment of the present invention, individual back-side gates 436 can be formed under the back-side gate insulator 432 and coupled to a back-side gate control line. It is further noted that the NAND architecture memory array 400 of FIGS. 4A and 4B are for illustrative purposes and that NAND architecture memory arrays 400 utilizing back-side trap dual-gate memory cells of embodiments of the present invention are also possible and will be apparent to those skilled in the art with the benefit of the present disclosure. It is also noted that methods have been disclosed that allow for formation of sub-feature details in memory arrays, allowing for reduced feature word lines 406, memory cells 402 and separating N+ diffusions 434 of the NAND memory array 400 of FIGS. 4A and 4B. Such methods of forming symmetric sub-feature elements are detailed in U.S. Pat. No. 4,776,922, titled "FORMATION OF VARIABLE WIDTH SIDEWALL STRUCTURES," issued Oct. 11, 1988.

It is also noted that isolation regions, typically formed of an oxide insulator, can be used between NAND architecture memory cell strings 420 to isolate each string 420 from its neighbors. These isolation regions can be extended into the substrate 422 to allow the formation of P-wells, where each P-well contains a single NAND architecture memory cell string 420 that can be biased in isolation from the other strings or rows of the array 400. It is also noted that the control gate/word address lines 406 and select lines 408, 410 can cross these isolation regions so that each control gate/word address line 406 and select line 408, 410 controls the operation of memory cells 402 and select gates 404 respectively across multiple rows of NAND architecture memory cell strings 420.

Figure 5B:
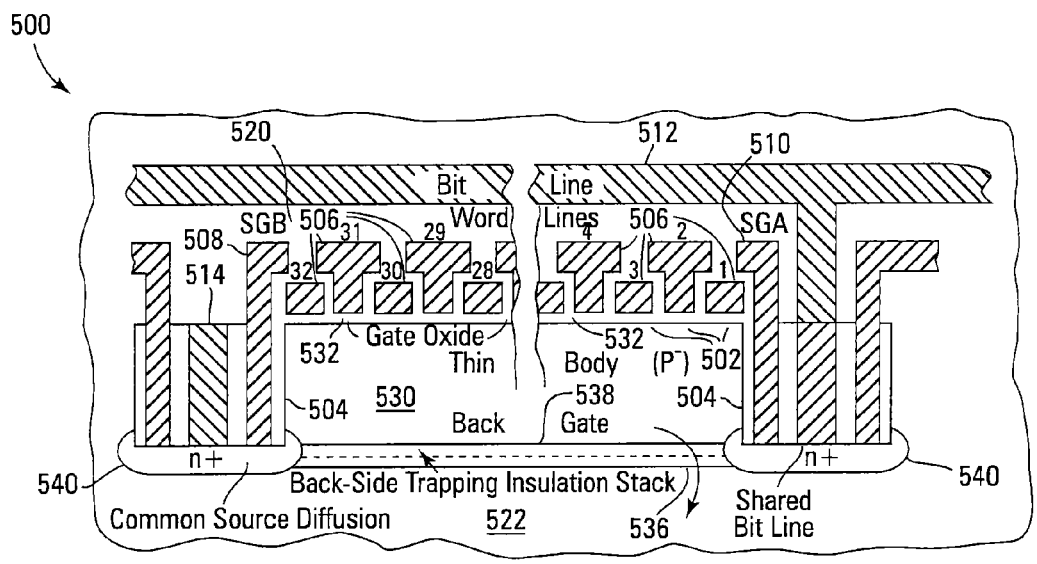
FIGS. 5A-5C detail NAND architecture memory array and memory cell strings in accordance with another embodiment of the present invention.
Figure 5A:
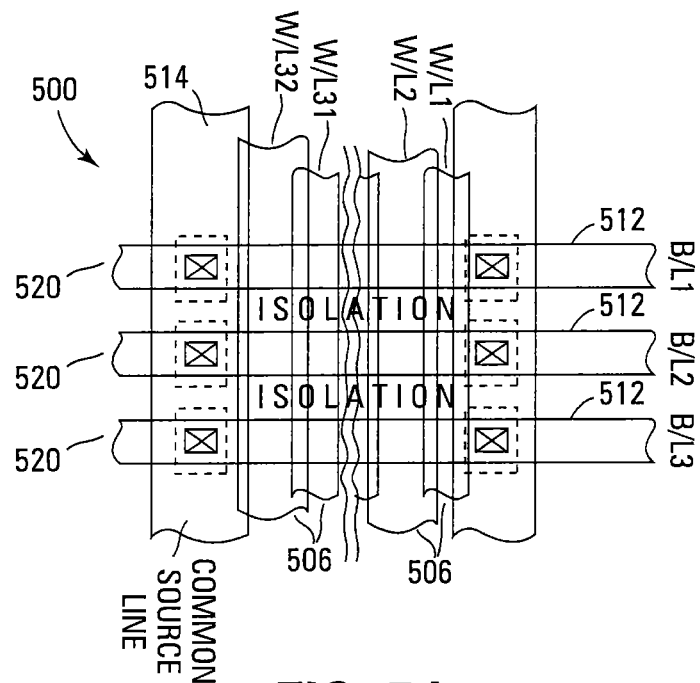
Figure 5C:
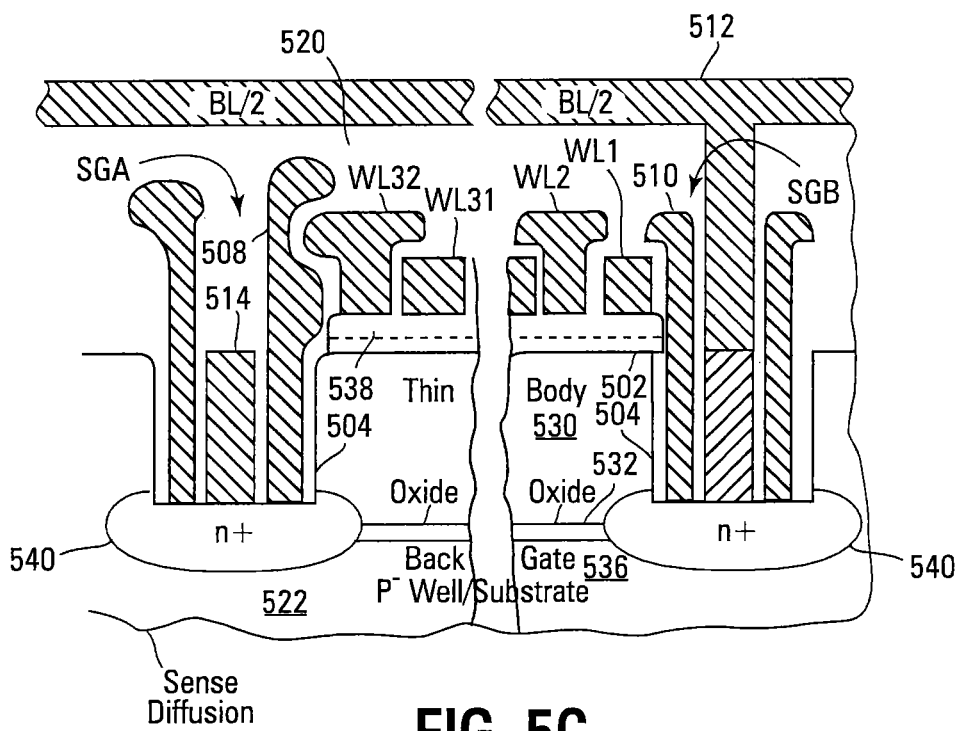

FIGS. 5A-5C detail a simplified top view and cross-sectional side views of front-side and back-side trap NAND arrays of another embodiment of the present invention. FIG. 5A details a top view of a NAND architecture memory array 500 having a series of NAND memory strings 520 of embodiments of the present invention. FIG. 5B details a cross-sectional side view of the NAND array 500, detailing a NAND memory strings 520 with a coupled series of back-side trap dual-gate non-volatile memory cells 502. FIG. 5C details a cross-sectional side view of the NAND array 500 with front-side trap dual-gate non-volatile memory cell 502 NAND memory strings 520.

In FIG. 5B, a series of back-side trap dual-gate non-volatile memory cells 502 are coupled together in a series NAND string 520 (typically of 8, 16, 32, or more cells). As described above, each dual-gate memory cell FET 502 has a top or front-side gate-insulator stack formed over the channel region 530 and a bottom or back-side gate-insulator stack 538 formed under the channel region 530. The back-side gate-insulator stack 538 is made of a composite asymmetric bandgap tunnel insulator layer formed beneath the thin body channel region 530, a floating node/trapping layer formed below the tunnel insulator layer, a charge blocking insulator layer formed under the trapping layer on the substrate 522 that operates as the back-side gate 536. The front-side gate-insulator stack is made of an insulator layer 532 formed over the thin body channel region 530. A word line control gate 506 is formed over the front-side gate insulator layer 532. In FIGS. 5A-5C, the word lines 506 are formed with an alternating "T" pattern, where every other word line 506 is formed in a "T" shape that overlaps the adjacent word lines 506 to allow for close array spacing and a decrease in the overall resistance of the "T" shaped word lines 506. The thin body channel region 530 operates to couple the adjacent memory cell 502 of the NAND memory strings 520 together. Vertical select gates 504, that are coupled to gate select lines 508, 510, are formed in trenches at either end of the NAND string 520 and selectively couple opposite ends of the NAND string 520 to bit lines 512 and source lines 514. The vertical select gates 504 have a gate-insulator stack made of an insulator formed on a sidewall of the trench with a control gate formed over the insulator. It is noted that the channel length of each vertical select gate 504 is determined by the depth of the trenches and not by the minimum feature size, allowing them be designed such that they can avoid short channel length issues. The gate-insulator stack of the select gates 504 are formed by successive layering and anisotropically etching of each of the materials of the gate insulator stack over the trenches. It is noted that the thin body channel region 530 is in contact with source and drain regions 540 of the select gates 504 to ease formation of a channel of carriers in the thin body channel region 530. These source/drain regions 540 are formed in the bottom of the select gate trenches and contact the back-side gate-insulator stack 538 and the channel body 530. The source line 514 and bit line 512 contacts couple to the select gate 504 source/drain regions 540 in the bottom of the select gate trenches, allowing for further array size reduction. It is noted that in another embodiment of the present invention, individual back-side gates 536 can be formed under the back-side gate-insulator stack 538 and coupled to a back-side gate control line.

In FIG. 5C, a series of front-side trap dual-gate non-volatile memory cells 502 are coupled together in a series NAND string 520 (typically of 8, 16, 32, or more cells). As described above, each dual-gate memory cell FET 502 has a top or front-side gate-insulator stack 538 formed over the channel region 530 and a bottom or back-side gate-insulator stack formed under the channel region 530. The front-side gate-insulator stack 538 is made of a composite asymmetric bandgap tunnel insulator layer on top of the thin body channel region 530, a floating node/trapping layer formed on the tunnel insulator layer, charge blocking insulator layer formed over the trapping layer, and a control gate formed over the charge blocking layer. The back-side gate-insulator stack is made of an insulator layer 532 formed under the thin body channel region 530 on top of the substrate 522, which takes the place and function of the back-side gate 536. In one embodiment of the present invention, each NAND architecture memory string 520 of memory is formed in an isolation trench, allowing the substrate 522 of each isolation trench to be individually biased for programming and erasure. An alternating "T" word line control gate 506 is formed over the front-side gate-insulator stacks 538. The thin body channel region 530 operates to couple the adjacent memory cell 502 of the NAND memory strings 520 together. Vertical select gates 504, that are coupled to gate select lines 508, 510, are formed in trenches at either end of the NAND string 520 and selectively couple opposite ends of the NAND string 520 to bit lines 512 and source lines 514. It is noted that the thin body channel region 530 is in contact with the source and drain regions 540 of the select gates 504 to ease formation of a channel of carriers in the thin body channel region 538. It is also noted that in another embodiment of the present invention, individual back-side gates 536 can be formed under the back-side gate insulator 532 and coupled to a back-side gate control line.

As can be seen from FIGS. 4A-4B and 5A-5C, in a NAND architecture memory string 420, and 520, each planar memory cell transistor 402, 502 would occupy an area of 2 F squared. Where "F" is the minimum resolvable photolithographic dimension in the particular process technology. The two vertically formed select transistors and bit line or source line contact occupy the area that a single planar select transistor would occupy (an area of 4 F squared when viewed from above, each transistor having an area of 2 F squared). Since each memory cell transistor can store up to two bits of data the data storage density approaches one bit for each 2 F squared unit area. Thus, for example, if F=0.1 micron then the storage density could be up to 5.0× Giga bit per square centimeter.

Figure 6:
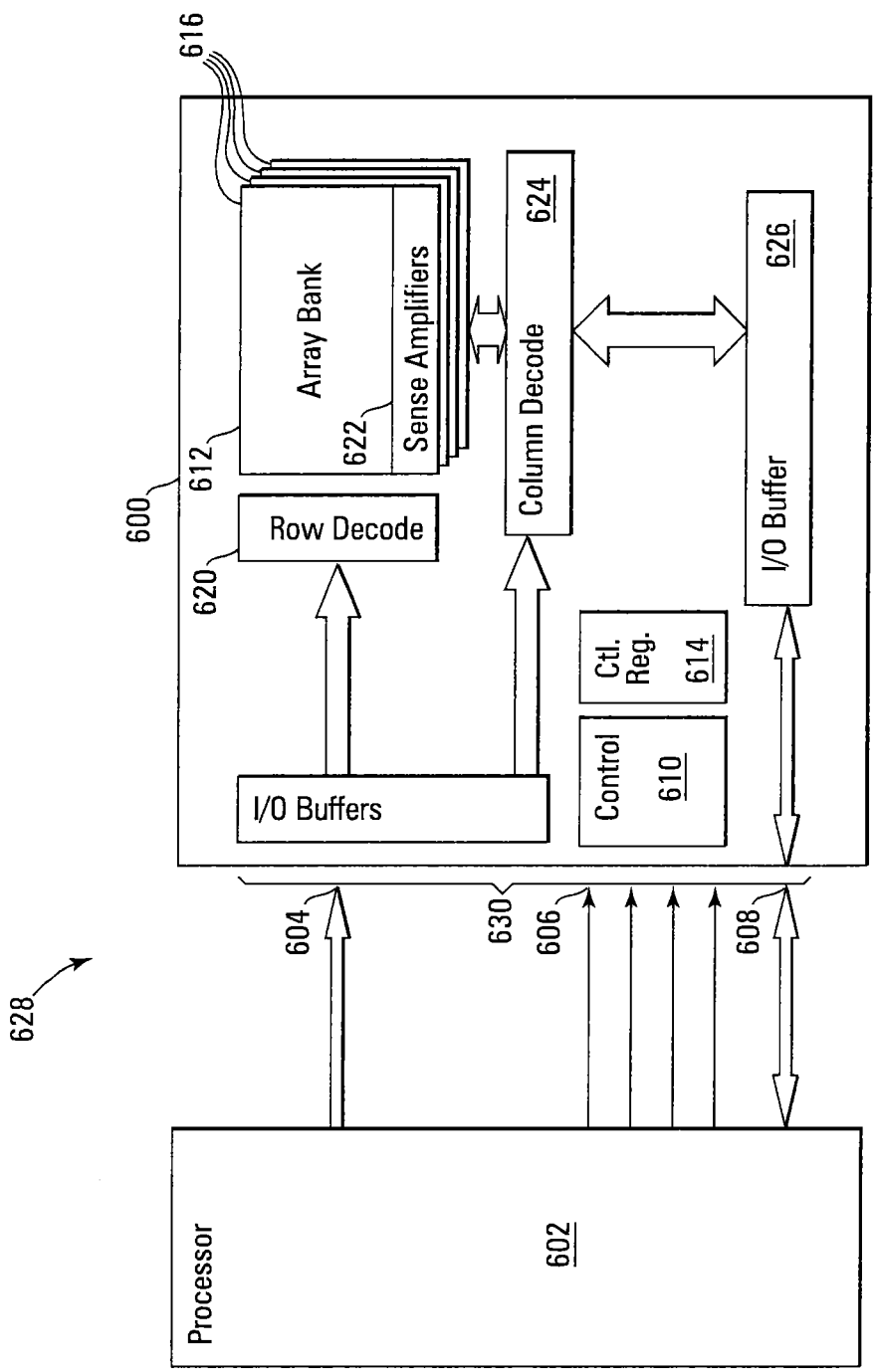
FIG. 6 details a system with a memory device in accordance with embodiments of the present invention.

FIG. 6 shows a simplified diagram of a system 628 incorporating a non-volatile NAND architecture front-side or back-side trap memory device 600 of the present invention coupled to a host 602, which is typically a processing device or memory controller. The non-volatile memory device 600 has an interface 630 that contains an address interface 604, control interface 606, and data interface 608 that are each coupled to the processing device 602 to allow memory read and write accesses. It is noted that other memory interfaces 630 that can be utilized with embodiments of the present invention exist, such as a combined address/data bus, and will be apparent to those skilled in the art with the benefit of the present disclosure. In one embodiment of the present invention, the interface 630 is a synchronous memory interface, such as a SDRAM or DDR-SDRAM interface. Internal to the non-volatile memory device, an internal memory controller 610 directs the internal operation; managing the non-volatile memory array 612 and updating RAM control registers and non-volatile erase block management registers 614. The RAM control registers and tables 614 are utilized by the internal memory controller 610 during operation of the non-volatile memory device 600. The non-volatile memory array 612 contains a sequence of memory banks or segments 616. Each bank 616 is organized logically into a series of erase blocks (not shown). Memory access addresses are received on the address interface 604 of the non-volatile memory device 600 and divided into a row and column address portions. In one embodiment of the present invention, the non-volatile memory 600 is utilized by the host 602 as a universal or ideal memory, replacing both the RAM and ROM in the system 628.

On a read access the row address is latched and decoded by row decode circuit 620, which selects and activates a row/page (not shown) of memory cells across a selected memory bank. The bit values encoded in the output of the selected row of memory cells are coupled to a local bit line (not shown) and a global bit line (not shown) and are detected by sense amplifiers 622 associated with the memory bank. The column address of the access is latched and decoded by the column decode circuit 624. The output of the column decode circuit 624 selects the desired column data from the internal data bus (not shown) that is coupled to the outputs of the individual read sense amplifiers 622 and couples them to an I/O buffer 626 for transfer from the memory device 600 through the data interface 608.

On a write access the row decode circuit 620 selects the row page and column decode circuit 624 selects write sense amplifiers 622. Data values to be written are coupled from the I/O buffer 626 via the internal data bus to the write sense amplifiers 622 selected by the column decode circuit 624 and written to the selected non-volatile memory cells (not shown) of the memory array 612. The written cells are then reselected by the row and column decode circuits 620, 624 and sense amplifiers 622 so that they can be read to verify that the correct values have been programmed into the selected memory cells.

It is noted that other memory cells, memory strings, arrays, and memory devices in accordance with embodiments of the present invention are possible and should be apparent to those skilled in the art with benefit of the present disclosure.

Conclusion

Non-volatile memory devices and arrays have been described that utilize dual gate (or back-side gate) non-volatile memory cells with band engineered gate-stacks that are placed above or below the channel region in front-side or back-side charge trapping gate-stack configurations in NAND memory array architectures. The band-gap engineered gate-stacks with asymmetric or direct tunnel barriers of the floating node memory cells of embodiments of the present invention allow for low voltage tunneling programming and efficient erase with electrons and holes, while maintaining high charge blocking barriers and deep carrier trapping sites for good charge retention. The direct tunneling program and efficient erase capability reduces damage to the gate-stack and the crystal lattice from high energy carriers, reducing write fatigue and leakage issues and enhancing device lifespan, while allowing for memory cells that can take advantage of progressive lithographic and feature size scaling. In one embodiment, the memory cell architecture allows for improved high density memory devices or arrays with the utilization of reduced feature word lines and integral vertical select gates. Memory cell embodiments of the present invention also allow multiple levels of bit storage in a single memory cell, and erase with hole injection from the front or back-side control gate.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A method of operating a NAND architecture dual-gate non-volatile memory cell string, comprising:
    programming a selected dual-gate non-volatile memory cell of a plurality of dual-gate non-volatile memory cells via direct tunneling of carriers through a tunnel insulator layer, wherein the tunnel insulator layer is an asymmetric band-gap tunnel insulator layer having two or more sub-layers formed adjacent to a thin body channel region of a dual-gate non-volatile memory cell, wherein the two or more sub-layers comprise direct tunnel layers of material of increasing conduction band offset and increasing dielectric K value; and
    trapping the carriers in a trapping layer formed under the tunnel insulator layer.

2. The method of claim 1, further comprising selecting the dual-gate non-volatile memory cell string by coupling the NAND architecture dual-gate non-volatile memory cell string to a bit line and a source line via vertical select gates.

3. The method of claim 1, wherein trapping the carriers in a trapping layer formed under the tunnel insulator layer further comprises trapping the charge localized proximate to a source/drain region of the back-side trap non-volatile memory cell for multiple bit storage.

4. The method of claim 1, further comprising erasing the NAND architecture dual-gate non-volatile memory cell string by removing the carriers trapped on the trapping layers of the plurality of non-volatile memory cells via one of direct tunneling, Fowler-Nordheim tunneling, channel hot electron (CHE) injection, and hot hole injection from the channel region.

5. The method of claim 1, further comprising erasing the NAND architecture dual-gate non-volatile memory cell string by removing the carriers trapped on the trapping layers of the plurality of dual-gate non-volatile memory cells via transporting carriers to or from the trapping layer through a charge blocking layer formed adjacent the trapping layer.

6. The method of claim 1, wherein programming a selected dual-gate non-volatile memory cell of a plurality of dual-gate non-volatile memory cells via direct tunneling of carriers through a tunnel insulator layer comprises applying a field across the tunnel insulator layer to induce direct tunneling of electrons from the channel region to the trapping layer.

7. A method of operating a dual-gate non-volatile memory cell, comprising:

programming the dual-gate non-volatile memory cell via direct tunneling of carriers through a tunnel insulator, wherein the tunnel insulator is an asymmetric band-gap tunnel insulator layer containing two or more sub-layers formed adjacent a channel region, wherein each of the two or more sub-layers comprise direct tunnel layers of increasing conduction band offset and increasing dielectric K value; and trapping the carriers in a floating node, wherein the floating node is on a side of the tunnel insulator opposite the channel region.

8. The method of claim 7, further comprising erasing the dual-gate non-volatile memory cells using direct tunneling of holes from the channel region into the floating node.

9. The method of claim 8, further comprising erasing the dual-gate non-volatile memory using enhanced Fowler-Nordheim tunneling of electrons from the floating node to the channel region.

10. The method of claim 7, further comprising reading the dual-gate non-volatile memory cell by generating a channel of minority carriers in the channel region.

11. The method of claim 10, wherein generating a channel of minority carriers in the channel region comprises raising a voltage potential of a gate of the dual-gate non-volatile memory cell that is on a side of the channel region opposite the tunnel insulator.

12. The method of claim 11, wherein generating a channel of minority carriers in the channel region further comprises raising a voltage potential of a second gate of the dual-gate non-volatile memory cell that is on a side of the channel region as the tunnel insulator while raising the voltage potential of the gate of the dual-gate non-volatile memory cell that is on the side of the channel region opposite the tunnel insulator.

13. The method of claim 11, wherein raising the voltage potential of the gate of the dual-gate non-volatile memory cell that is on the side of the channel region opposite the tunnel insulator comprises raising the voltage potential of a substrate.

14. The method of claim 10, wherein reading the dual-gate non-volatile memory cell comprises sensing a data value of the dual-gate non-volatile memory cell while generating the channel of minority carriers in the channel region.

15. The method of claim 14, wherein sensing a data value of the dual-gate non-volatile memory cell comprises determining a property selected from the group consisting of a current flow of the dual-gate non-volatile memory cell or a threshold voltage at which the dual-gate non-volatile memory cell activates.

16. The method of claim 7, wherein programming the dual-gate non-volatile memory cell comprises encoding multiple data bits via a method selected from the group consisting of using multiple charge centroids of the dual-gate non-volatile memory cell, and modulating the Vt level of the dual-gate non-volatile memory cell.

17. The method of claim 7, further comprising erasing the dual-gate non-volatile memory cells using at least one method selected from the group consisting of using direct tunneling of holes from the channel region into the floating node, and using enhanced Fowler-Nordheim tunneling of electrons from the floating node to the channel region.

18. The method of claim 7, wherein trapping the carriers in a floating node comprises trapping the carriers in a charge trapping dielectric.

19. The method of claim 7, wherein trapping the carriers in a floating node comprises trapping the carriers in a charge trapping dielectric having metal nanocrystals embedded therein.

20. A method of operating a dual-gate non-volatile memory cell, comprising:

programming the dual-gate non-volatile memory cell by applying a field across a tunnel insulator to induce direct tunneling of electrons from a channel region to a charge trapping medium, wherein the tunnel insulator is an asymmetric band-gap tunnel insulator layer containing two or more sub-layers formed adjacent the channel region, wherein each of the two or more sub-layers comprise direct tunnel layers of increasing conduction band offset and increasing dielectric K value; and trapping the carriers in charge trapping medium, wherein the charge trapping medium is on a side of the tunnel insulator opposite the channel region.

21. The method of claim 20, wherein programming the dual-gate non-volatile memory cell comprises:

programming a dual-gate non-volatile memory cell having a first gate comprising a substrate on which the dual-gate non-volatile memory cell is formed, and having a second gate comprising an access gate of the dual-gate non-volatile memory cell;

wherein the dual-gate non-volatile memory cell further comprises:
a charge blocking insulator; and
a gate insulator;
wherein the charge blocking insulator is between the charge trapping medium and a particular one of the first gate and the second gate; and
wherein the gate insulator is between the channel region and the other one of the first gate and the second gate.

* * * * *